United States Patent
Waldis et al.

(10) Patent No.: US 9,791,691 B2
(45) Date of Patent: Oct. 17, 2017

(54) MIRROR ARRAY

(71) Applicant: Carl Zeiss SMT GmbH, Oberkochen (DE)

(72) Inventors: Severin Waldis, Bern (CH); Sebastian Lani, Courtman (CH); Benedikt Knauf, Aalen (DE); Jian Deng, Biel (CH); Roger Marc Bostock, Muensingen (CH)

(73) Assignee: Carl Zeiss SMT GmbH, Oberkochen (DE)

( * ) Notice: Subject to any disclaimer, the term of this patent is extended or adjusted under 35 U.S.C. 154(b) by 559 days.

(21) Appl. No.: 14/031,464

(22) Filed: Sep. 19, 2013

(65) Prior Publication Data

US 2014/0055767 A1    Feb. 27, 2014

Related U.S. Application Data

(63) Continuation of application No. PCT/EP2012/055239, filed on Mar. 23, 2012.

(Continued)

(30) Foreign Application Priority Data

Mar. 25, 2011    (DE) ........................ 10 2011 006 100

(51) Int. Cl.
*G02B 26/08*    (2006.01)
*G02B 7/18*    (2006.01)
*G03F 7/20*    (2006.01)

(52) U.S. Cl.
CPC ....... *G02B 26/0816* (2013.01); *G02B 7/1815* (2013.01); *G02B 26/0833* (2013.01);
(Continued)

(58) Field of Classification Search
CPC ............ G02B 26/0816; G02B 26/0833; G02B 7/1815; G02B 6/3518; G02B 7/1821;
(Continued)

(56) References Cited

U.S. PATENT DOCUMENTS 6,934,072 B1    8/2005    Kim et al.
7,145,269 B2    12/2006    Hol et al.
(Continued)

FOREIGN PATENT DOCUMENTS

CN    1961239 A    5/2007
CN    101946190 A    1/2011
(Continued)

OTHER PUBLICATIONS

Taiwanese office action, with English translation thereof, for TW Appl No. 101 110 078, dated Apr. 18, 2014.
(Continued)

*Primary Examiner* — Steven H Whitesell Gordon
(74) *Attorney, Agent, or Firm* — Fish & Richardson P.C.

(57) ABSTRACT

A mirror array having a total surface extending perpendicularly to a surface normal, comprises a multiplicity of mirror elements each having a reflection surface and at least one degree of freedom of displacement, wherein the totality of the mirror elements form a parqueting of a total reflection surface of the mirror array, and wherein the mirror array is embodied modularly as a tile element in such a way that the parqueting of the total reflection surface can be extended by a tiling of a plurality of such mirror arrays.

23 Claims, 25 Drawing Sheets

Related U.S. Application Data

(60) Provisional application No. 61/470,633, filed on Apr. 1, 2011.

(52) U.S. Cl.
CPC .......... *G03F 7/702* (2013.01); *G03F 7/70075* (2013.01); *G03F 7/70116* (2013.01); *G03F 7/70825* (2013.01); *Y10T 29/49117* (2015.01)

(58) Field of Classification Search
CPC .. G03F 7/70075; G03F 7/70116; G03F 7/702; G03F 7/70825; Y10T 29/49117; B81B 2201/042
See application file for complete search history.

(56) References Cited

U.S. PATENT DOCUMENTS

| | | | |
|---|---|---|---|
| 7,777,959 B2 | 8/2010 | Sohn et al. | |
| 2004/0130561 A1* | 7/2004 | Jain | G03F 7/70291 345/694 |
| 2005/0275814 A1 | 12/2005 | Eib et al. | |
| 2009/0128886 A1* | 5/2009 | Hirota | G03F 7/70116 359/291 |
| 2010/0053922 A1* | 3/2010 | Ebefors | H01L 21/762 361/772 |
| 2011/0001947 A1 | 1/2011 | Dinger et al. | |
| 2014/0327895 A1* | 11/2014 | Waldis | G02B 26/0833 355/67 |
| 2014/0327896 A1* | 11/2014 | Waldis | G02B 26/0833 355/67 |

FOREIGN PATENT DOCUMENTS

| | | |
|---|---|---|
| TW | 200602679 A | 1/2006 |
| TW | 200804867 A | 1/2008 |
| WO | WO 2005/119331 A1 | 12/2005 |
| WO | WO 2009/100856 A1 | 8/2006 |
| WO | WO 2007/134574 | 11/2007 |
| WO | WO 2010/049076 | 5/2010 |

OTHER PUBLICATIONS

Chinese office action, with English translation thereof, for CN Appl No. 2012 8002 5247.8, dated Mar. 27, 2015.
Japanese office action with English translation with respect to parallel JP Appl. No. 2014-500 414, dated Oct. 6, 2015.
German Examination Report, with translation thereof, for corresponding DE Appl No. 10 2011 006 100.2, dated Feb. 6, 2012.
International Search Report for corresponding PCT Appl No. PCT/EP2012/055239, dated Nov. 19, 2012.
"Baugruppentechnologie der Elektronik-Montage" ["Technology of Electronic Assembly Units"] Editor: Wolfgang Scheel, 2nd edition, Verlag Technik, Berlin, 1999, with English translation.
Chinese office action, with English translation thereof, for corresponding CN Application No. 2012 8002 5247.8, dated Jan. 8, 2016.

* cited by examiner

MIRROR ARRAY

CROSS-REFERENCE TO RELATED APPLICATIONS

The present application is a continuation of, and claims benefit under 35 USC 120 to, international application PCT/EP2012/055239, filed Mar. 23, 2012, which claims benefit under 35 USC 119 of German Application No. 10 2011 006 100.2, filed Mar. 25, 2011. International application PCT/EP2012/055239 also claims priority under 35 USC 119(e) to U.S. Provisional Application No. 61/470,633, filed Apr. 1, 2011. The entire disclosure of international application PCT/EP2012/055239 is incorporated by reference herein.

FIELD

The invention relates to a mirror array. The invention furthermore relates to an optical component and an optical assembly comprising a mirror array of this type. The invention furthermore relates to a method for producing an optical component of this type and an optical assembly of this type. Moreover, the invention relates to a tool for handling an optical component. Finally, the invention relates to an optical unit for a projection exposure apparatus, an illumination system for an EUV projection exposure apparatus, a projection exposure apparatus, a method for producing a micro- or nanostructured component, and a component produced according to this method.

BACKGROUND

Optical assemblies comprising mirrors consisting of a plurality of individual mirrors are known from the prior art. WO 2010/049 076 A2 discloses, for example, a mirror array having a plurality of displaceable individual mirrors.

SUMMARY

One object of the present invention is to improve mirror arrays of this type.

This object is achieved via a mirror array having a total surface extending perpendicularly to a surface normal. The mirror array includes a multiplicity of mirror elements each having a reflection surface and at least one degree of freedom of displacement. The totality of the mirror elements form a parqueting of a total reflection surface of the mirror array. The mirror array is embodied modularly as a tile element in such a way that the parqueting of the total reflection surface can be extended by a tiling of a plurality of such mirror arrays. The heart of the invention consists in embodying a mirror array modularly in such a way that the reflection surface of the mirror array can be extended in any desired manner by juxtaposing a plurality of arrays of this type. This is achieved by virtue of the fact that the mirror array is embodied as a tile element, and, consequently, a surface of substantially any desired size can be parqueted with arrays of this type.

A parqueting should be understood here and hereinafter to mean that the distance between two tile elements, that is to say two mirror arrays, which is always present for practical applications is negligible, in particular for the envisaged applications. The degree of filling of the multi-array reflection surface composed of a plurality of mirror arrays is preferably at least 0.75, in particular at least 0.8, in particular at least 0.85, in particular at least 0.9, in particular at least 0.95. In this case, the term degree of filling denotes the ratio of the total reflection surface to the total surface. By virtue of such a high degree of filling, radiation losses are avoided, in other words the light throughput, that is to say transmission, is increased.

The parqueting is, in particular, a tesselation. Such a modular embodiment of the mirror array as a tile element which can be used for parqueting, in particular tesselating, a surface of any desired size and shape opens up great flexibility in the production of mirrors whose mirror surface is adjustable.

The total surface area which can be parqueted with mirror arrays of this type can have a size of 400×400 mm$^2$, for example. It can also have a different size. Moreover, the shape of the total surface which can be parqueted with the arrays is substantially as desired. A boundary condition is merely given by the total surface area of an individual mirror array. The latter is, in particular, in the range of 1 mm$^2$ to 10 000 mm$^2$, in particular in the range of 10 mm$^2$ to 1000 mm$^2$, in particular in the range of 100 mm$^2$ to 500 mm$^2$. The individual mirror arrays have, for example, a rectangular, in particular a square, total surface. However, they can also be embodied in triangular or hexagonal fashion. In principle, other shapes are also possible.

The mirror array comprises a multiplicity of mirror elements which form a parqueting of the total reflection surface of the mirror array. The degree of filling, in some instances also designated as integration density, of the mirror array is preferably at least 0.85, in particular at least 0.9, in particular at least 0.95.

The mirror array comprises a multiplicity of mirror elements. The number of mirror elements of the array is in particular at least 4, in particular at least 16, in particular at least 64, in particular at least 256, in particular at least 1024. The mirror elements can be arranged in particular in matrix-like fashion, that is to say in rows and columns.

The mirror elements of the mirror array each have at least one degree of freedom of displacement. This is taken to mean a degree of freedom of the displacement of the respective mirror element relative to a substrate or a carrying structure which carries the mirror elements and relative to which the mirror elements are displaceable. The mirror elements each have at least one, preferably at least two, in particular at least three, degrees of freedom of displacement. This involves, in particular, at least one degree of freedom of tilting and/or translation. They have, in particular, two degrees of freedom of tilting. This enables the total reflection surface of the mirror array to be adapted very flexibly to the respective requirements. Radiation beams, in particular partial radiation beams, can thus be deflected flexibly via the mirror array according to the invention.

The radiation beams can be EUV radiation, in particular having a wavelength in the range of between 5 nm and 30 nm, in particular in the range of between 10 nm and 15 nm. This is advantageous particularly when using the mirror arrays in projection exposure apparatuses for producing micro- or nanostructured components, in particular semiconductor chips.

In accordance with the total surface projecting beyond the total reflection surface by at most 5 mm in a direction perpendicular to the surface normal, the mirror array has only a small lateral overhang (lateral overhead). The degree of filling of the mirror array and, in particular, of the multi-array reflection surface composed of a plurality of arrays is increased as a result. The total surface of the mirror array projects beyond the total reflection surface of the array in particular by at most 5 mm, in particular at most 3 mm, in particular at most 1 mm, in particular at most 0.5 mm, in particular at most 0.3 mm, in particular at most 0.2 mm, in particular at most 0.1 mm, in the direction perpendicular to a surface normal. The ratio of lateral overhang (lateral overhead) to total extent in the same direction is in particular at most 0.1, in particular at most 0.05, in particular at most 0.03, in particular at most 0.02, in particular at most 0.01. The overhang is smaller than the total extent of the mirror array in the same direction in particular by at least one order of magnitude. A virtually seamless juxtaposition of a plurality of mirror arrays is made possible as a result. The mirror arrays can thus be arranged in a substantially densely packed manner, that is to say substantially without any gaps.

A further object of the invention is to improve an optical component comprising a mirror array.

This object is achieved an optical component that includes a mirror array as described above and a carrying structure, which is arranged in a manner offset with respect to the mirror array in the direction of the surface normal. The carrying structure projects beyond the total surface of the mirror array by at most 1 mm in a direction perpendicular to the surface normal. The heart of the invention consists in arranging the mirror array on a carrying structure, which is arranged with respect to the mirror array using the shadow casting principle. The carrying structure projects beyond the total surface of the mirror array in particular by at most 5 mm, in particular by at most 3 mm, in particular by at most 1 mm, in particular by at most 0.5 mm, in particular by at most 0.3 mm, in particular by at most 0.2 mm, in particular by at most 0.1 mm, in a direction perpendicular to the surface normal. Preferably, the carrying structure does not project at all beyond the total surface of the mirror array. In other words, it has a lateral overhead of 0. Its cross section perpendicular to the surface normal is, in particular, identical to that of the mirror array. A densely packed arrangement of optical components of this type is made possible as a result. This leads to a high degree of filling. In principle, it is also possible to embody the carrying structure with a negative lateral overhead, that is to say with a cross section which is smaller than the total surface of the mirror array.

Preferably, the optical component is embodied modularly. It is embodied, in particular, as a tile element in such a way that the total reflection surface can be extended in any desired manner by a tiling of a plurality of tile elements of this type.

In accordance with the carrying structure being mechanically connected to the mirror array exclusively in an edge region, the carrying structure is mechanically connected to the mirror array exclusively in an edge region. The mechanical decoupling between the mirror array and the carrying structure is improved as a result. In principle, it is also possible to mechanically connect the mirror array to the carrying structure in a central region, in particular exclusively in a central region.

The width of the edge region in a direction perpendicular to the surface normal corresponds in particular, precisely to the lateral overhead of the total surface of the mirror array beyond the total reflection surface thereof. The edge region is embodied in mechanically stable fashion despite its small width. This is made possible by virtue of the fact that the carrying structure is made from a material having high mechanical stability. By way of example, ceramic materials, silicon, silicon dioxide, aluminum nitride and aluminum oxide are appropriate as material for the carrying structure. However, other materials are likewise conceivable. A mechanically stable embodiment of the carrying structure improves the mechanical handlability of the component.

Moreover, the integration of further functional constituent parts into the carrying structure is made possible as a result.

The carrying structure has a cutout on the side facing the mirror array. The cutout is surrounded by the edge region in a direction perpendicular to the surface normal. Via the cutout it is possible to arrange further constituent parts of the optical component in a space-saving manner in the carrying structure Moreover, the signal paths can be shortened as a result.

In accordance with a control device for controlling the displacement of the mirror elements being integrated into the carrying structure provision can be made, in particular, for integrating a control device for controlling the displacement of the mirror elements into the carrying structure. The control device can preferably be arranged in the cutout in the carrying structure. It is preferably embodied as a so-called application specific integrated circuit (ASIC), sometimes also referred to as an electronic displacement circuit. An electronic displacement circuit (ASIC) of this type can be produced cost-effectively. Moreover, it can be adapted to the respective requirements very flexibly. It can be bonded directly to the rear side of the mirror array facing the carrying structure. This obviates signal conduction and redistribution in the region with the greatest density and number of signals. A so-called interposer can therefore be dispensed with. So-called flip-chip contacts can preferably be provided for making contact with the ASIC. It is possible, in particular, to arrange all the contact-connections of the ASIC on the same side of the ASIC, in particular on the side facing the mirror array. Through-plating of the ASIC, which is also possible in principle, can thus be obviated. This facilities the production of the ASIC. In particular, all signal connections, in particular all electrical contacts, between the mirror array and the ASIC are situated on the same side of the ASIC. This makes it possible to arrange all lines on the rear side of the mirror array in a single layer. This simplifies the production process and leads to a reduction of the production costs.

The ASICs perform at least a portion of the signal processing tasks for controlling the mirror elements. They are signal-connected to a central control device. The spatially adjacent arrangement of the ASICs and the assignment thereof to the mirror elements reduce the requirements made of signal transmission between the central control device and the actuators of the mirror elements. As a result, firstly a compact construction of the optical component is made possible. Secondly, the influence of parasitic electromagnetic fields is reduced and interference signals are reduced.

Advantageously, a thermal interface can be provided between the ASIC and the carrying structure. This makes it possible to dissipate the heat from the ASIC through the carrying structure. A thermal interface of this type can be embodied for example as a corrugated metal foil, also referred to as a spring foil, or as an array of metal springs.

Signal lines for driving the mirror elements are integrated in the carrying structure. In this case, a signal flow takes place from an electrical interface on the opposite side of the carrying structure relative to the mirror array through the carrying structure and the ASIC to the mirror array, or in the opposite direction. The signal lines in the carrying structure are preferably embodied as plated-through holes, in particular as through-silicon vias (TSV). They can be embodied, in particular as through holes filled with gold. Plated-through holes of this type can be produced in a batch process.

It has been recognized according to the invention that, for a modular construction of the optical component, it is advantageous to reduce to the greatest possible extent the number and density of the signals within the component from the plane of the mirror array as far as the interface. The signal reduction in the region of the ASIC is preferably in the range of 4:1 to 7:1. A larger ASIC having greater signal reduction is also possible in principle. Further signal reduction is provided in the region between the ASIC and the interface. The further signal reduction is, in particular, at least 4:1, in particular at least 10:1. It can be achieved by combination of specific signals, for example supply voltages for the control device. As a result, firstly the number of necessary lines and/or contacts is reduced; secondly, such combination provides for increased redundancy in the contact-connection.

The ASICs can be driven serially. This allows, in particular, reduction of the required signal lines.

Via the signal lines integrated into the carrying structure, it is possible to conduct the electrical signal flow from and to each optical component in the direction of the surface normal. A vertical integration firstly of the component parts of the component and secondly of the signal flow in the component parts is thus made possible. In principle, it is also possible to achieve purely vertical signal conduction from the mirror array to the interface of the component. For this purpose, the ASICs can be provided with plated-through holes, in particular through-silicon vias (TSV) and double-sided contact-connection. As a result, the signal paths are shortened further. Moreover, the thermal paths are also shortened as a result.

On account of the signal reduction it is additionally possible to minimize the electrical interface of the optical component. Provision is made for arranging the electrical interface on the opposite side, the rear side, of the carrying structure relative to the mirror array. The interface is arranged, in particular, completely on the rear side of the carrying structure. A lateral arrangement of contacts can be dispensed with. The flexible arrangeability of the components relative to one another is improved as a result. In principle, it is also possible to provide one or a plurality of additional interfaces for connecting adjacently arranged components laterally on the carrying structure.

The connections of the interface can be embodied as contact pins. They are preferably embodied as pins integrated into the carrying structure, so-called "via" pins. As a result, firstly the production of the interface is facilitated; secondly, the risk of damage, in particular during production, is reduced. As an alternative thereto, electrical contacts embodied in planar fashion on the rear side of the carrying structure or a plug connection interface are or is also possible. Contacts embodied in planar fashion increase the tolerance, that is to say the required accuracy, in the arrangement of the components. The arrangement of the components is simplified as a result.

The carrying structure can comprise at least one ferromagnetic element. Handling and/or fixing of the component via magnetic forces is made possible as a result. The ferromagnetic element can be embodied as a metal plate or metal foil. The ferromagnetic element can also be embodied in permanent magnetic fashion. It can, in particular, be composed of a permanent magnetic material. It can be arranged in the cutout of the carrying structure, in particular between the ASIC and the carrying structure. As an alternative or in addition thereto, a ferromagnetic element of this type can be provided on the rear side of the carrying structure. It can be bonded onto the carrying structure. It can also be directly applied, in particular applied electrolytically, to the carrying structure and/or the ASIC. This leads to a particularly reliable and stable connection between the magnetic element and the carrying structure.

A further object of the invention is to improve an optical assembly comprising at least one component in accordance with the portrayal presented above. This object is achieved via an optical assembly that includes a baseplate for arranging optical components and at least one optical component as described above. The at least one optical component is fixed via a fixing device on the baseplate.

The heart of the invention consists in fixing the at least one optical component on a baseplate via a fixing device. The baseplate is embodied in mechanically stiff fashion. It therefore gives the assembly a structural stability. It simultaneously serves as a heat sink. The size and shape of the baseplate can be chosen substantially freely. It is, in particular, independent of the technological limits of the remaining components of the assembly. The baseplate can be embodied as flat. It can also be embodied as curved. The baseplate is advantageously embodied with good thermal conductivity. It has a thermal conductivity of at least 150 W/(mK). The thermal conductivity of the baseplate can be in particular 220 W/(mK), in particular at least 350 W/(mK). It can be made in particular from metal, for example of copper or aluminum. Its surface can be polished, in particular. In principle, the baseplate can also be composed of a material having poor thermal conductivity, in particular quartz or glass. In this case, it is provided with so-called "thermal vias" that is to say through holes filled with a highly thermally conductive material, in particular copper.

In order to improve the cooling of the assembly, in particular the transfer of heat away from the optical components, a cooling system can additionally be provided. The cooling system is thermally connected to the baseplate. It can, in particular, be integrated into the baseplate. It can in this case be arranged exclusively in predetermined regions, in particular in edge regions, of the baseplate. It can also be arranged in the baseplate in a manner running parallel to the orientation of the baseplate. Integration of the cooling system into the baseplate leads to a particularly advantageous cooling capacity. It is also possible for the baseplate to be indirectly linked to a separate cooling system. A separate cooling system enables a mechanical decoupling thereof from the baseplate. In order to ensure the flow of heat from the baseplate to the cooling system, soft elements having high thermal conductivity can be provided in this case. Copper cables, copper foils or elements composed of encapsulated, highly oriented graphite, so-called HOPG, are appropriate, in particular, for this purpose. Oscillations of the mirror elements of the optical component that are excited by the flow of cooling liquid can thereby be avoided.

The assembly can comprise a plurality of optical components of the type described above, which optical components are in particular embodied identically. An assembly can comprise at least five optical components. It can comprise in particular at least 16, in particular at least 64, in particular at least 256, in particular at least 1024, optical components of this type. It can preferably be extended in any desired manner. This therefore makes it possible to adapt the size and form of the assembly very flexibly to the respective requirements.

Preferably, the distance between adjacently arranged components is at most 1 mm, in particular at most 500 µm, particular at most 300 µm, in particular at most 200 µm, in particular at most 100 µm, particular at most 50 µm. The distance between two adjacently arranged components is, in particular, at most of the same magnitude as the absolute value by which the total surface of an optical component projects beyond the total reflection surface thereof. Such a densely packed arrangement of the optical components on the baseplate enables a virtually gapless parqueting of surfaces of any desired size with mirror arrays of the type described above. This therefore makes it possible, in particular, to parquet surfaces of any desired size and/or shaped in any desired fashion with displaceable mirror elements.

The at least one optical component can be arranged in exchangeable fashion on the baseplate. In particular, it is exchangeable in a non-destructive manner. This further increases the flexibility of the arrangement of the optical components on the baseplate. Moreover, an exchangeable arrangement of the components on the baseplate is advantageous for repair purposes. In principle, it is also possible for the components to be fixedly connected, in particular adhesively bonded, to the baseplate. The mechanical stability and/or the thermal conduction can thereby be improved. In such a case, the fixing device is embodied as an adhesive layer, for example.

The fixing device can comprise a magnetic mechanism. It comprises, in particular, permanent magnets integrated into the baseplate. It can have additional ferromagnetic elements and/or electromagnets. The permanent magnets can be formed from a vacuum-suitable, highly magnetic material or a corresponding material combination. In particular, samarium-cobalt magnets or neodymium-iron-boron magnets are appropriate. Alternative materials are likewise possible. The permanent magnets of the fixing device can be integrated completely into the baseplate, that is to say surrounded completely by the baseplate. They can be arranged in an encapsulated manner in the baseplate. In principle, an exchangeable arrangement of the permanent magnets in the baseplate is also conceivable.

The permanent magnets are dimensioned and arranged in particular in such a way that they can be used to exert a holding force of at least 10 N on a component arranged on the baseplate. With the aid of the magnets, the components can thus be securely fixed on the baseplate.

During the mounting/demounting of the optical components on the baseplate, in particular thermal processes can be dispensed with.

It can be particularly advantageous to arrange the permanent magnets in the baseplate and the magnetic elements in the optical component in such a way that a self-aligning orientation of the optical components on the baseplate occurs. In this case, in particular, the position of the optical components on the baseplate can be defined in a direction perpendicular to the surface normal. Additional mechanical alignment means can be dispensed with. It goes without saying that additional mechanical alignment means can also be provided.

The force exerted by the magnets of the fixing device on the optical components is advantageously regulatable. For this purpose, the distance between the magnets and that surface of the baseplate which faces the optical components can be adjustable. As an alternative and/or in addition thereto, the force exerted by the permanent magnets of the fixing device on the optical components can be regulated by at least temporarily applying a further magnetic field. Such an additional, temporary magnetic field can be generated in a particularly simple manner via additional electromagnets. The latter are preferably arranged on the opposite side of the permanent magnets relative to the optical components, in particular on the rear side of the baseplate. They can be arranged, in particular, in a releasable manner on the rear side of the baseplate. This has the advantage that they can be arranged on the rear side of the baseplate for the mounting and/or demounting of the components on the baseplate, but can be removed again after the baseplate has been equipped with the optical components. Via the additional electromagnets, the force exerted by the permanent magnets on the optical components can be compensated for very precisely and/or location-specifically, that is to say in particular component-specifically. This makes it possible, in particular, to form the mechanical connection between the baseplate and the optical components in such a way that it forms a so-called zero insertion force interface (ZIF) at least during the mounting/demounting process.

Furthermore, optical means for simplifying the orientation of the components can be provided on the baseplate. This further simplifies the mounting of the components.

In order to simplify the demounting of the components, openings can be provided in the baseplate. Openings of this type can enable the components to be demounted in a manner supported by compressed air. Provision can be made, in particular, for arranging one or a plurality of openings in the baseplate for each optical component to be arranged on the baseplate.

In order to simplify the mounting of the optical components on the baseplate, provision can be made for arranging sprung contact pins, so-called sprung pins, in the baseplate, in particular integrating them into the latter. The sprung pins serve for producing an electrical contact with the electrical interface on the rear side of the carrying structure of the optical components. They are arranged in particular in such a way that they become located on the electrical contact areas of the interface during the arrangement of an optical component on the baseplate. In this case, the contact resistance between a pin of this type and the contact at the optical component is in particular at most 100 mΩ. Voltage fluctuations that can occur on account of current spikes are reduced by a small contact resistance. Moreover, the evolution of heat during signal transmission is also reduced as a result.

The contact pins are preferably arranged in rows. This facilitates production. They can, in particular, be cast in ceramic, glass or Teflon and be integrated in groups into the baseplate. The contact pins can be arranged in particular in each case in rows, in particular in double rows between the magnets of the fixing device in the baseplate. Such a grid-like arrangement contributes to the modular construction of the assembly.

An embodiment of the contact pins sprung on both sides is particularly advantageous. They facilitate both the arrangement of the optical components on the baseplate and the arrangement of, for example, a signal line from a central control device and/or a circuit board or further electronic components on the rear side of the baseplate.

Through the use of sprung, in particular doubly sprung, contact pins, the tolerances between the latter and the corresponding mating surfaces of the respective electrical contacts can be made generous. In the case of a tapering embodiment of the contact pins, the tolerance corresponds precisely to half the diameter or half the edge length of the mating surfaces of the respectively associated electrical contacts. It is 0.5 mm for example in the case of a mating surface having an edge length of 1 mm. This facilities the production of the baseplate in particular the arrangement and/or mounting of the contact pins therein. Since a multiplicity of electrical contacts are provided for each optical component to be arranged on the baseplate, such a simplification is particularly advantageous. The number of electrical contacts between the baseplate and an individual optical component is in particular at least 20, in particular at least 30, in particular at least 50, in particular at least 70. This number is dependent on the size of the optical components, in particular on the number of mirror elements of the mirror array of a component of this type.

Furthermore, provision can be made for arranging circuit boards, in particular ceramic or metallic circuit boards (PCBs) for signal pick-up and conduction on the rear side of the baseplate. This further simplifies the signal conduction for controlling the mirror elements. Accordingly, additional electronic components, in particular for regulating the signal distribution on the baseplate, can be arranged on the rear side of the baseplate. Electronic components of this type can contain, in particular calibration data of the individual optical components.

A further object of the invention is to improve a method for producing an optical component. This object is achieved via a method for producing an optical component as described above. The method includes the following steps: providing a wafer stack having at least one mirror array as described above and a covering substrate, providing a carrier substrate, pretreating the carrier substrate, and connecting the carrier substrate to the wafer stack. A batch method is provided for connecting the carrier substrate to the wafer stack.

The heart of the invention consists in carrying out the so-called packaging, that is to say the connection of the mirror array to the carrying structure, completely in a batch process, that is to say at the wafer level. Further process steps which proceed at the chip level rather than at the wafer level can be dispensed with. This significantly simplifies the production of the component.

A further object of the invention is to provide a tool for handling the components described above. This object is achieved via a tool for handling an optical component as described above. The tool comprises at least one electromagnet for generating a predetermined holding force, and at least one spacer element for defining a predetermined mechanical contact region between the tool and the component. The heart of the invention consists in embodying a feature comprising at least one electromagnet for generating an individually controllable holding force and a spacer element for predefining the mechanical contact region between the tool and the optical component.

The spacer element is preferably embodied in such a way that, during the handling of the optical components, it is in contact exclusively with an edge running around the total reflection surface of the mirror array. This firstly avoids contact with the mirror elements. This secondly ensures that the tool in the region of the carrying structure does not project beyond the component laterally, that is to say in a direction perpendicular to the surface normal. This enables the components to be arranged in a densely packed fashion on the baseplate.

The tool comprises at least one, in particular a plurality of, preferably individually drivable electromagnet(s). Via the electromagnet(s), firstly a holding force for holding the optical component can be generated; secondly, the holding force exerted by the magnets of the fixing device of the baseplate on the optical component can be compensated for via the magnets of the tool. The tool thus enables particularly soft, vibration-free arrangement of the optical components on the baseplate.

The tool can additionally have at least one, in particular a plurality of, pressure-sensitive sensor(s) for monitoring the application pressure of the optical component on the tool. The sensor(s) can be part of a regulating device that regulates the holding force generated by the magnets of the tool.

Furthermore, the tool can have one or a plurality of optical sensors, for example cameras, in particular miniature cameras, via which the orientation of the optical components relative to the baseplate can be monitored and/or aligned. Furthermore, a first distance sensor can be provided, via which the distance between the tool and the optical component can be measured. In one particularly advantageous embodiment, the tool has at least one, in particular a plurality of, in particular at least three, distance sensors via which the distance and the orientation of the tool, in particular of the optical component held by the latter, with respect to the baseplate can be measured. Moreover, the tool can have at least one, in particular a plurality of, auxiliary device(s), in particular of optical type, for supporting the orientation of the tool and thus of the component held by the latter relative to the baseplate. Moreover, the tool can comprise a positioning system, in particular a so-called Pick-and-Place robot. Further details and advantages will become apparent from the description of an exemplary embodiment.

A further object of the invention is to specify a method for producing the optical assembly. This object is achieved via a method for producing an optical assembly as described above. The method comprises the following steps: providing the baseplate with a magnetic fixing device, and arranging the components on the baseplate. For the purpose of arranging the components on the baseplate, the force exerted by the magnets on the respective component to be arranged is at least partly compensated for via an additional magnetic field. The heart of the invention consists, for the purpose of arranging a component on the baseplate, in the fixing force exerted on the component by the magnets of the fixing device being at least partly, in particularly completely, compensated for via an additional magnetic field. The fixing force exerted by the magnets of the fixing device on the component to be arranged is compensated for in particular only temporarily, that is to say during the arrangement of the respective component. The additional magnetic field can be compensated for, for example, via one or a plurality of electromagnets arranged in the tool for handling the optical component. It can also be compensated for via one or a plurality of magnets arranged on the rear side of the baseplate, in particular one or a plurality of electromagnets. The compensation of the fixing force exerted by the fixing element on the component to be arranged makes it possible to ensure that the component is placed very gently, in particular in a vibration-free manner, onto the baseplate. This enables, in particular, repeated, non-destructive fitting and removal of the individual optical components. During the mounting of the component in particular temporarily, the baseplate forms a so-called zero insertion force interface (ZIF) for the optical component. Provided that the holding force exerted by the tool on the optical component is strong enough, it can suffice if the fixing force exerted by the magnets of the fixing device on the component is only partly precompensated for.

In accordance with a further advantageous aspect of the invention, the optical components for arrangement on the baseplate and during removal from the latter are touched by the tool exclusively on the opposite side of the components to the baseplate. This has the advantage that even in the case of dense packing of many components on the baseplate, an arbitrary component can be exchanged, that is to say removed and/or inserted again. The remaining components in particular do not have to be removed for this purpose. Moreover, this type of handling of the optical components prevents possible damage to the bonding region between the mirror array and the carrying structure during contact.

Further objects of the invention are to improve an optical unit, in particular an illumination and/or a projection optical unit, for a projection exposure apparatus, an illumination system for an EUV projection exposure apparatus, and also a projection exposure apparatus of this type. These objects are achieved via an optical unit for a projection exposure apparatus including an assembly as described above, an illumination system for an EUV projection exposure apparatus including such an optical unit and an EUV radiation source, and a projection exposure apparatus for EUV microlithography including such an optical unit. The advantages correspond to those described above. Further aspects of the invention consist in improving a method for producing a micro- or nanostructured component and in improving a component produced in this way. These objects are achieved a method for producing a micro- or nanostructured component comprising the following steps: providing a substrate, to which a layer composed of a light-sensitive material is at least partly applied, providing a reticle having structures to be imaged, providing a projection exposure apparatus as described above, and projecting at least one part of the reticle (24) onto a region of the light-sensitive layer of the substrate with the aid of the projection exposure apparatus, as well as a component produced by such a method. The advantages likewise correspond to those that have already been explained.

BRIEF DESCRIPTION OF THE DRAWINGS

Further details and advantages of the invention will become apparent on the basis of the description of a plurality of exemplary embodiments with reference to the drawings, in which.

DETAILED DESCRIPTION OF THE PREFERRED EMBODIMENTS

Firstly the basic construction of a projection exposure apparatus 1 will be described below with reference to the figures.

Figure 1:
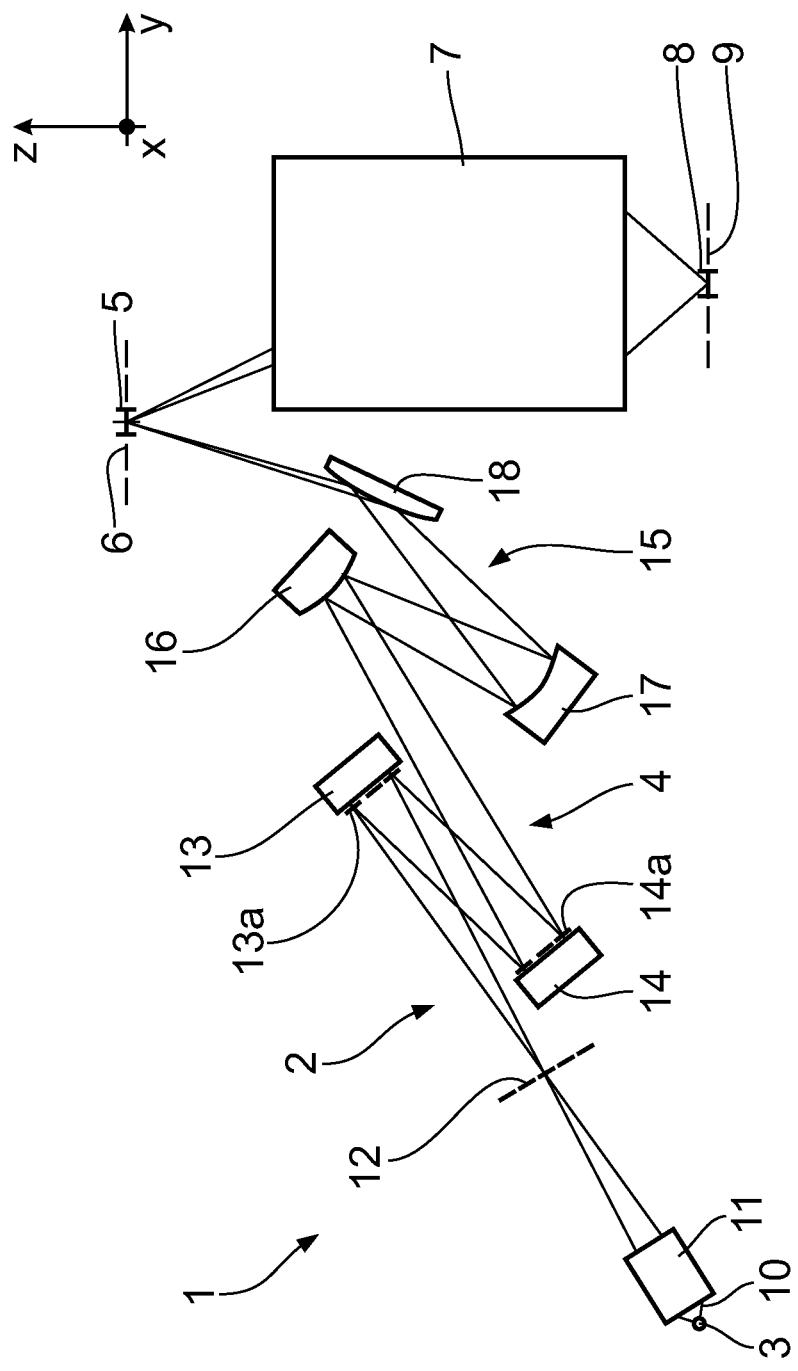
FIG. 1 shows a schematic illustration of a projection exposure apparatus for microlithography with an illumination system and a projection optical unit in meridional section.

FIG. 1 schematically shows a projection exposure apparatus 1 for microlithography in meridional section. An illumination system 2 of the projection exposure apparatus 1 has, besides a radiation source 3, an illumination optical unit 4 for exposing an object field 5 in an object plane 6. The object field 5 can be fashioned rectangularly or arcuately with an x/y aspect ratio of 13/1, for example. In this case, a reflective reticle (not illustrated in FIG. 1) arranged in the object field 5 is exposed, the reticle bearing a structure to be projected by the projection exposure apparatus 1 for the production of micro- or nanostructured semiconductor components. A projection optical unit 7 serves for imaging the object field 5 into an image field 8 in an image plane 9. The structure on the reticle is imaged onto a light-sensitive layer of a wafer arranged in the region of the image field 8 in the image plane 9, the wafer not being illustrated in the drawing.

The reticle, which is held by a reticle holder (not illustrated), and the wafer, which is held by a wafer holder (not illustrated), are scanned synchronously in the y-direction during the operation of the projection exposure apparatus 1. Depending on the imaging scale of the projection optical unit 7, it is also possible for the reticle to be scanned in the opposite direction relative to the wafer.

With the aid of the projection exposure apparatus 1, at least one part of the reticle is imaged onto a region of a light-sensitive layer on the wafer for the lithographic production of a micro- or nanostructured component, in particular of a semiconductor component, for example of a microchip. Depending on the embodiment of the projection exposure apparatus 1 as a scanner or as a stepper, the reticle and the wafer are moved in a temporally synchronized manner in the y-direction continuously in scanner operation or step by step in stepper operation.

The radiation source 3 is an EUV radiation source having an emitted used radiation in the range of between 5 nm and 30 nm. This can involve a plasma source, for example a GDPP source (gas discharge produced plasma) or an LPP source (laser produced plasma). Other EUV radiation sources, for example those based on a synchrotron or on a free electron laser (FEL), are also possible.

EUV radiation 10 emerging from the radiation source 3 is concentrated by a collector 11. A corresponding collector is known for example from EP 1 225 481 A. Downstream of the collector 11, the EUV radiation 10 propagates through an intermediate focal plane 12 before it impinges on a field facet mirror 13 having a multiplicity of field facets 13a. The field facet mirror 13 is arranged in a plane of the illumination optical unit 4 which is optically conjugate with respect to the object plane 6.

The EUV radiation 10 is hereinafter also designated as used radiation, illumination light or as imaging light.

Downstream of the field facet mirror 13, the EUV radiation 10 is reflected by a pupil facet mirror 14 having a multiplicity of pupil facets 14a. The pupil facet mirror 14 lies either in the entrance pupil plane of the illumination optical unit 7 or in a plane that is optically conjugate with respect thereto. The field facet mirror 13 and the pupil facet mirror 14 are constructed from a multiplicity of individual mirrors, which will be described in even greater detail below. In this case, the subdivision of the field facet mirror 13 into individual mirrors can be such that each of the field facets 13a, which by themselves illuminate the entire object field 5, is represented by exactly one of the individual mirrors. Alternatively, it is possible for at least some or all of the field facets 13a to be constructed by a plurality of such individual mirrors. The same correspondingly applies to the configuration of the pupil facets 14a of the pupil facet mirror 14 respectively assigned to the field facets 13a, which pupil facets can in each case be formed by a single individual mirror or by a plurality of such individual mirrors.

The EUV radiation 10 impinges on the two facet mirrors 13, 14 at an angle of incidence, measured with normal incidence with respect to the mirror surface, which is less than or equal to 25°. Therefore, the EUV radiation 10 is applied to the two facet mirrors 13, 14 in the range of normal incidence operation. Application with grazing incidence is also possible. The pupil facet mirror 14 is arranged in a plane of the illumination optical unit 4 which constitutes a pupil plane of the projection optical unit 7 or is optically conjugate with respect to a pupil plane of the projection optical unit 7. With the aid of the pupil facet mirror 14 and an imaging optical assembly in the form of a transmission optical unit 15 having mirrors 16, 17 and 18 designated in the order of the beam path for the EUV radiation 10, the field facets of the field facet mirror 13 are imaged into the object field 5 in a manner superimposed on one another. The last mirror 18 of the transmission optical unit 15 is a mirror for grazing incidence ("grazing incidence mirror"). The transmission optical unit 15 together with the pupil facet mirror 14 is also designated as subsequent optical unit for transferring the EUV radiation 10 from the field facet mirror 13 toward the object field 5. The illumination light 10 is guided from the radiation source 3 toward the object field 5 via a plurality of illumination channels. Each of the illumination channels is assigned a field facet 13a of the field facet mirror 13 and a pupil facet 14a of the pupil facet mirror 14 disposed downstream thereof. The individual mirrors of the field facet mirror 13 and of the pupil facet mirror 14 can be tiltable by an actuator system, with the result that a change in the assignment of the pupil facets 14a to the field facets 13a and accordingly a changed configuration of the illumination channels can be achieved. This results in different illumination settings which differ in the distribution of the illumination angles of the illumination light 10 over the object field 5.

In order to facilitate the explanation of positional relationships, inter alia a global cartesian xyz coordinate system is used hereinafter. The x-axis runs perpendicularly to the plane of the drawing toward the observer in FIG. 1. The y-axis runs toward the right in FIG. 1. The z-axis runs upward in FIG. 1.

A local cartesian xyz coordinate system is depicted in selected figures from among the subsequent figures, wherein the x-axis runs parallel to the x-axis according to FIG. 1 and the y-axis together with the x-axis spans the optical surface of the respective optical element.

Figure 2:
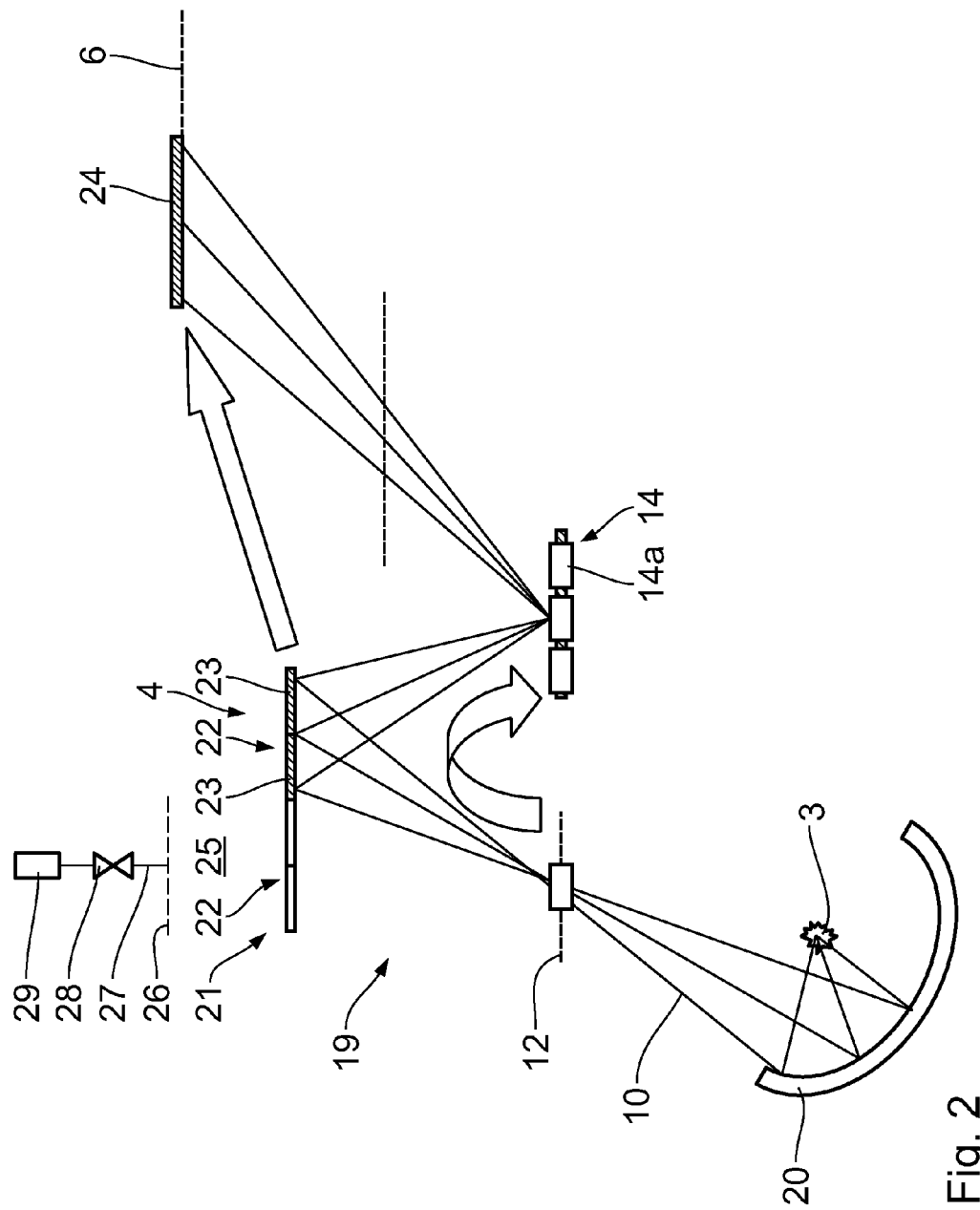
FIG. 2 shows an embodiment of an illumination systems of a projection exposure apparatus with a mirror array (MMA) and a pupil facet mirror illuminated by the latter, FIG. 3 schematically shows an exemplary plan view of the pupil facet mirror according to FIG. 2 with a pupil facet illumination corresponding to an illumination setting, FIG. 4 schematically shows the illumination system in accordance with FIG. 2 with a channel assignment of the mirror array to the pupil facet mirror, which channel assignment can be generated by displacement of the mirror elements.

FIG. 2 shows an alternative configuration of an illumination system 19 for the projection exposure apparatus 1. Components corresponding to those which have already been explained above with reference to FIG. 1 bear the same reference numerals and will not be discussed in detail again.

Used radiation 10 emerging from the radiation source 3, which can likewise be embodied as an LPP source, is firstly collected by a first collector 20. The collector 20 can be a parabolic mirror, which images the radiation source 3 into the intermediate focal plane 12 or focuses the light from the radiation source 3 onto the intermediate focus in the intermediate focal plane 12. The collector 20 can be operated such that the used radiation 10 is applied to it at angles of incidence of close to 0°. The collector 20 is then operated close to normal incidence and therefore also designated as a normal incidence (NI) mirror. A collector operated with grazing incidence can also be used instead of the collector 20.

Disposed downstream of the intermediate focal plane 12 is a field facet mirror 21 in the form of a multi- or micro-mirror array (MMA) as an example of an optical assembly for guiding the used radiation 10, that is to say the EUV radiation beam. The multi- or micro-mirror array (MMA) is also designated just as mirror array 22 hereinafter. The field facet mirror 21 is embodied as a microelectromechanical system (MEMS). It has a multiplicity of individual mirrors arranged in matrix-like fashion in rows and columns in an array. The individual mirrors are also designated as mirror elements 23 hereinafter. The mirror elements 23 are designed to be tiltable by an actuator system, as will also be explained below. Overall, the field facet mirror 21 has approximately 100 000 of the mirror elements 23. Depending on the size of the mirror elements 23, the field facet mirror 21 can also have for example 1000, 5000, 7000 or else hundreds of thousands of mirror elements 23, for example 500 000 mirror elements 23.

A spectral filter can be arranged upstream of the field facet mirror 21, the spectral filter separating the used radiation 10 from other wavelength components—not usable for the projection exposure—of the emission of the radiation source 3. The spectral filter is not illustrated.

Used radiation 10 having a power of 840 W and a power density of 6.5 kW/m$^2$ is applied to the field facet mirror 21. The used radiation 10 can also have a different power and/or power density.

The entire individual-mirror array of the facet mirror 21 has a diameter of 500 mm and is designed in a manner densely packed with the mirror elements 23. The area coverage, also designated as degree of filling or integration density, of the complete field facet array by the mirror elements 23 is at least 70%. The mirror elements 23 represent, insofar as a field facet 21a is realized by in each case exactly one mirror element 23, apart from a scaling factor, the form of the object field 5. The facet mirror 21 can be formed from 500 mirror elements 23 respectively representing a field facet 21a and having a dimension of approximately 5 mm in the y-direction and 100 mm in the x-direction. As an alternative to the realization of each field facet 21a by exactly one mirror element 23, each of the field facets 21a can be formed by groups of smaller mirror elements 23. A field facet 21a having dimensions of 5 mm in the y-direction and of 100 mm in the x-direction can be constructed e.g. via a 1×20 array of mirror elements 23 having the dimensions of 5 mm×5 mm through to a 10×200 array of mirror elements 23 having the dimensions of 0.5 mm×0.5 mm. According to the invention, the assignment of the mirror elements 23 to a field facet 21a is flexible. The field facets 21a are in particular first defined by suitable driving of the mirror elements 23. The form of the mirror elements 23 can be, in particular, independent of the form of the macroscopic field facets.

The used light 10 is reflected from the mirror elements 23 of the facet mirror 21 toward the pupil facet mirror 14. The pupil facet mirror 14 has approximately 2000 static pupil facets 14a. The latter are arranged in a plurality of concentric rings alongside one another, such that the pupil facets 14a of the innermost ring are configured in sector-shaped fashion and the pupil facets 14a of the rings directly adjacent thereto are configured in ring-sector-shaped fashion. In a quadrant of the pupil facet mirror 14, pupil facets 14a can be present alongside one another in each of the rings 12. Each of the pupil facets 14a can be embodied as a mirror array 22.

The used light 10 is reflected from the pupil facets 14a toward a reflective reticle 24 arranged in the object plane 6. The projection optical unit 7 then follows, as explained above in connection with the projection exposure apparatus according to FIG. 1.

A transmission optical unit 15 can again be provided between the facet mirror 14 and the reticle 24, as explained above in connection with the illumination optical unit 4 according to FIG. 1.

Figure 3:
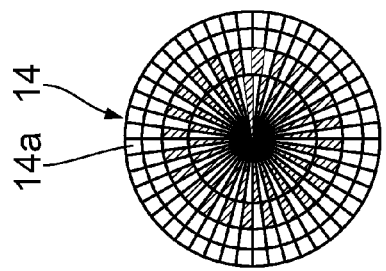

FIG. 3 shows by way of example an illumination of the pupil facets 14a of the pupil facet mirror 14, with which the conventional illumination setting according to FIG. 2 can approximately be achieved. In the two inner pupil facet rings of the pupil facet mirror 14, every second one of the pupil facets 14a is illuminated in a circumferential direction. This alternating illumination illustration in FIG. 3 is intended to symbolize the fact that the filling density realized in the case of this illumination setting is lower than in the case of an annular illumination setting by a factor of 2. A homogeneous illumination distribution is likewise sought in the two inner pupil facet rings, but with occupation density lower by a factor of 2. The two outer pupil facet rings illustrated in FIG. 3 are not illuminated.

Figure 5:
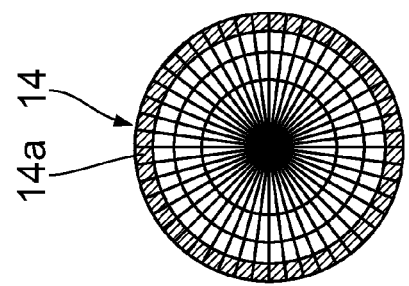
FIG. 5 shows a schematic plan view of the pupil facet mirror in accordance with FIG. 3 with a pupil facet illumination corresponding to an annular illumination setting.
Figure 4:
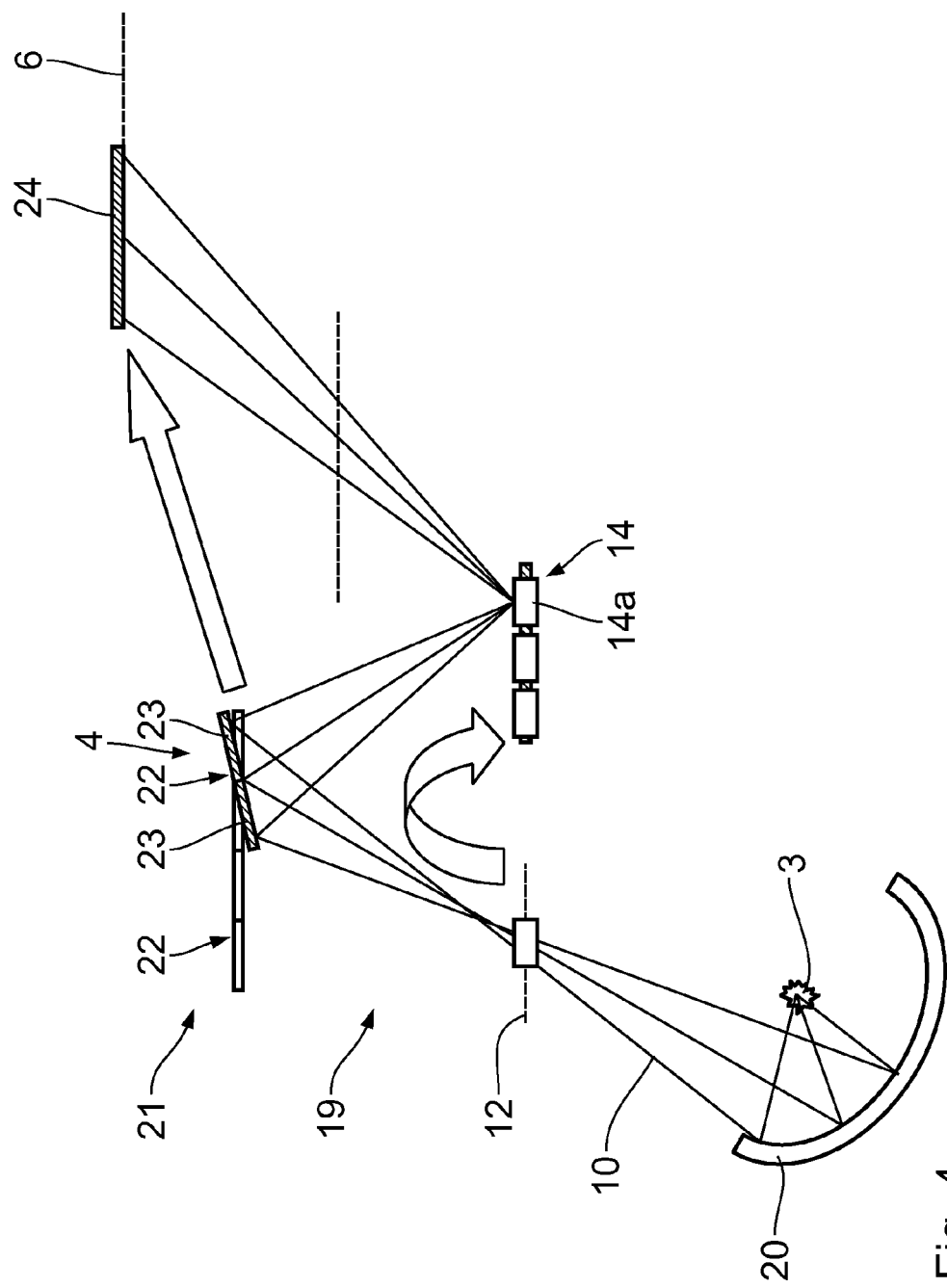

FIG. 4 schematically shows the conditions in the case of the illumination optical unit 4, insofar as an annular illumination setting is set there. The mirror elements 23 of the field facet mirror 21 are tilted by an actuator system with the aid of actuators (which will also be explained below) in such a way that on the pupil facet mirror 14 an outer ring of the ring-sector-shaped pupil facet 14a is illuminated with used light 10. This exemplary illumination of the pupil facet mirror 14 is illustrated in FIG. 5. The tilting of the mirror elements 23 for generating this illumination is indicated by way of example in FIG. 4 on the basis of the example of one of the mirror elements 23.

For changing over the illumination settings in accordance with FIGS. 2 to 5, the mirror elements 23 can be pivoted by a tilting angle. They are pivotable in particular by a tilting angle in the range of at least ±50 mrad, in particular at least ±80 mrad, in particular ±100 mrad. The respective tilting position can be complied with in this case with an accuracy of at least 0.2 mrad, in particular at least 0.1 mrad, in particular at least 0.05 mrad.

The mirror elements 23 bear multilayer coatings for optimizing their reflectivity at the wavelength of the used radiation 10. The temperature of the multilayer coatings should not exceed 425 K during the operation of the projection exposure apparatus 1. This is achieved via a construction of the mirror elements 23 which is explained by way of example below. The mirror elements 23 of the illumination optical unit 4, as indicated schematically in FIG. 2, are accommodated in an evacuatable chamber 25. FIG. 2 merely schematically indicates a boundary wall 26 of the evacuatable chamber 25. The chamber 25 communicates with a vacuum pump 29 via a fluid line 27, in which a shutoff valve 28 is accommodated. The operating pressure in the evacuatable chamber 25 is a few Pa (partial pressure $H_2$). All other partial pressures are distinctly below $10^{-7}$ mbar.

The mirror elements 23 are arranged in a substrate 30. The latter is mechanically connected to a mirror body 32 via a heat-conducting section 31. Part of the heat-conducting section 31 is an articulation body 33 that permits the mirror body 32 to be tilted relatively to the substrate 30. The articulation body 33 can be embodied as a solid-state articulation but permits the mirror body 32 to be tilted by defined degrees of freedom of tilting, for example about one or about two, in particular mutually perpendicularly arranged, tilting axes. The articulation body 33 has an outer holding ring 34 fixed to the substrate 30. Furthermore, the articulation body 33 has an inner holding body 35 connected to the outer holding ring 34 in an articulated manner. The holding body is arranged centrally below a reflection surface 36 of the mirror element 23. A spacer 37 is arranged between the central holding body 35 and the reflection surface 36.

Heat deposited in the mirror body 32, in particular heat generated by absorption of the impinging used radiation 10, is dissipated via the heat-conducting section 31, namely via the spacer 37, the central holding body 35 and the articulation body 33 and the outer holding ring 34, toward the substrate 30. A thermal power density of at least 10 kW/m², in particular at least 30 kW/m², in particular at least 50 kW/m², can be dissipated to the substrate 30 via the heat-conducting section 31. The thermal power dissipated to the substrate 30 can be, depending on the mirror element 23, at least 2.5 mW, in particular at least 7.5 mW, in particular at least 12.5 mW. The heat-conducting section 31 is alternatively designed for dissipating a thermal power density of at least 1 kW/m², or a power of at least 0.25 mW absorbed by the mirror body 32, to the substrate 30. The absorbed power can also be, alongside absorbed power of the used radiation 10 from the radiation source 3, absorbed electrical power, for example.

On the opposite side of the holding body 35 relative to the spacer 37, an actuator pin 38 is arranged on the holding body. The actuator pin 38 can have a smaller external diameter than the spacer 37. The actuator pin 38 can also have the same diameter as, or a larger diameter than, the spacer 37.

Figure 6:
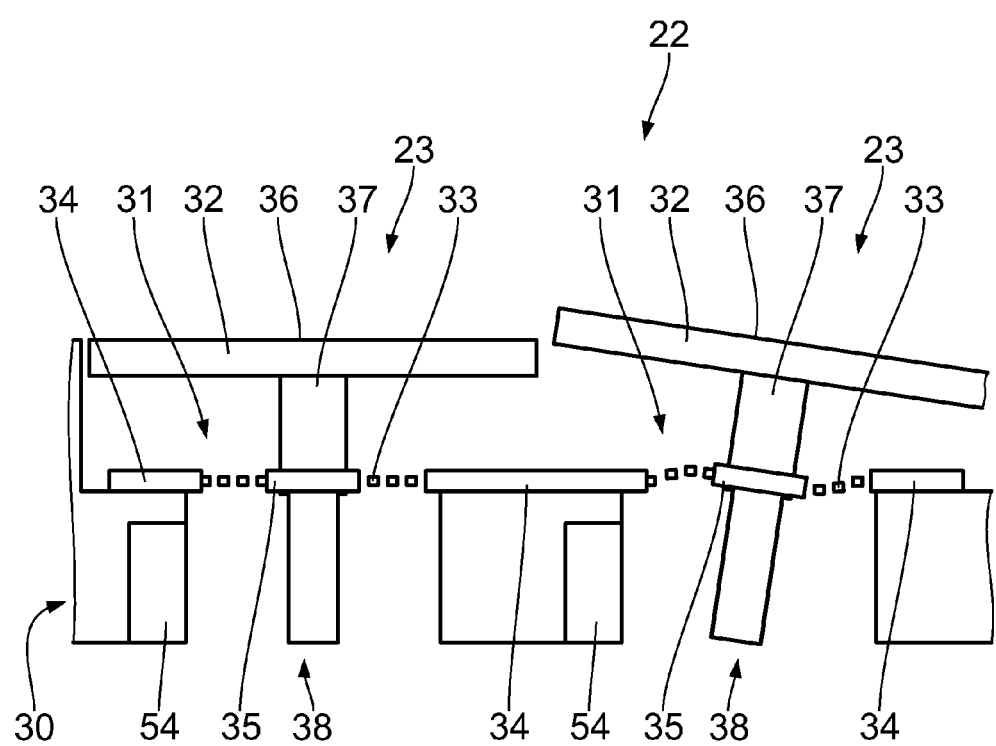
FIG. 6 shows a schematic illustration of two mirror elements of the mirror array in accordance with FIGS. 2 and 4, the mirror elements lying alongside one another.

The substrate 30 forms a sleeve surrounding the actuator pin 38. In each case a total of three electrodes 54 are integrated in the sleeve, which electrodes are arranged in a manner electrically insulated from one another and extending over approximately just less than 120° in each case in a circumferential direction. The electrodes 54 constitute counterelectrodes with respect to the actuator pin 38, which is embodied as an electrode pin in this embodiment. In this case, the actuator pin 38 can be embodied in particular as a hollow cylinder. In principle, it is also possible to provide a different number of electrodes 54 per actuator pin 38. In particular, four or more electrodes 54 can be provided per actuator pin 38. By generating a potential difference between one or more of the electrodes 54 and the actuator pin 38, it is possible to generate an electrostatic force on the actuator pin 38, which force, as illustrated by way of example in the right-hand half of FIG. 6, can lead to a deflection of the mirror element 23.

The substrate 30 can be formed, in particular, from a silicon wafer, on which an entire array of mirror elements 23 is arranged.

The actuator pin 38 can also be part of a Lorentz actuator. In this case, a permanent magnet is arranged at the free end of the actuator pin 38. The permanent magnet can be oriented in such a way that a north pole and a south pole thereof are arranged alongside one another along the actuator pin 38. A Lorentz actuator of this type is known for example from U.S. Pat. No. 7,145,269 B2. It can be produced in a batch process as a microelectromechanical system (MEMS). A force density of 20 kPa can be achieved with a Lorentz actuator of this type. The force density is defined as the ratio of the actuator force to that area of the actuator over which the actuator force acts. The cross section of the actuator pin 38 can serve as a measure of that side area of the actuator over which the actuator force acts and which is to be inherently considered.

As an alternative to the embodiment as Lorentz actuators, the actuators for tilting the mirror elements 23 can be embodied as reluctance actuators, for example in the manner of WO 2007/134 574 A, or as piezo-actuators. A force density of 50 kPa can be achieved with a reluctance actuator. Depending on the configuration, a force density of 50 kPa to 1 MPa can be achieved with a piezo-actuator.

For further details in particular of the arrangement of the individual mirrors 23 in the substrate 30 and their pivotability via the actuators and the embodiment of the articulation bodies and heat-conducting sections 31, reference should be made to WO 2010/049 076 A2.

Further aspects and details of an optical component 40 with the mirror array 22 are described below with reference to FIGS. 7 to 15. The mirror array 22 having the mirror elements 23 and the substrate 30 has a total surface extending perpendicularly to a surface normal 41. It comprises a multiplicity of the mirror elements 23, which each have a reflection surface 36 and two degrees of freedom of displacement. Generally, the mirror elements 23 have at least one degree of freedom of displacement. They can also have three or more degrees of freedom of displacement. They have in particular at least one degree of freedom of tilting, preferably at least two degrees of freedom of tilting. They can also have a degree of freedom of translation. The reflection surface 36 can have an extent of 0.5 mm×0.5 mm, 1 mm×1 mm, 4 mm×4 mm, 8 mm×8 mm or 10 mm×10 mm. It can also deviate from the square shape. Other dimensions of the reflection surface 36 are likewise possible.

The mirror array 22 has in particular at least 4, in particular at least 16, in particular at least 64, in particular at least 256, in particular at least 1024 mirror elements 23. The latter are preferably arranged in a rectangular, in particular a square, matrix. The mirror elements 23 have a square cross section. They can also be embodied in triangular, rectangular or hexagonal fashion, in principle. They are embodied as parquet elements. The totality of the mirror elements 23 forms a parqueting of a total reflection surface of the mirror array 22. The parqueting is a tesselation, in particular. The mirror elements 23 are arranged in particular in a densely packed manner. The mirror array has in particular a degree of filling of at least 0.85, in particular at least 0.9, in particular at least 0.95. In this case, the degree of filling, in some instances also designated as integration density, designates the ratio of the total reflection surface, that is to say the sum of the reflection surfaces 36 of all the mirror elements 23 of the mirror array 22, to the total surface of the array 22.

The reflection surface 36 of the mirror elements 23 is embodied as flat. In principle, it can also be embodied as concave or convex or as a freeform surface.

The reflection surface 36 of the mirror elements 23 is provided in particular with a (multilayer) coating for optimizing its reflectivity at the wavelength of the used radiation 10. The multilayer coating enables, in particular, the reflection of used radiation 10 having a wavelength in the EUV range, in particular in the range of 5 nm to 30 nm.

The mirror array 22 is embodied modularly. It is embodied as a tile element in particular in such a way that the parqueting of the total reflection surface of the mirror array 22 can be extended in any desired manner by a tiling of a plurality of tile elements of this type, that is to say of a plurality of identically embodied mirror arrays 22. In this case, the different terms "parqueting" and "tiling" are used merely in order to distinguish between the parqueting of the total reflection surface of an individual mirror array 22 by the mirror elements 23 and that of a multi-mirror array by the plurality of mirror arrays 22. They both designate a gapless and overlap-free covering of a simply connected domain in one plane. Even if the covering of the total reflection surface is not perfectly gapless in the present case, which is reflected in a degree of filling of <1, the term parqueting or tiling is employed hereinafter provided that the degree of filling has the value specified above, in particular at least 0.85.

The mirror elements 23 are held by the substrate 30. The substrate 30 has an edge region 42 extending in a direction perpendicular to the surface normal 41. The edge region 42 is arranged, in particular, circumferentially around the mirror elements 23. It has, in a direction perpendicular to the surface normal 41, a width b, in particular a maximum width b, of at most 5 mm, in particular at most 3 mm, in particular at most 1 mm, in particular at most 0.5 mm, in particular at most 0.3 mm, in particular at most 0.2 mm. The total surface of the mirror array 22 thus projects beyond the total reflection surface, that is to say beyond the outer edge thereof, by at most 5 mm, in particular at most 3 mm, in particular at most 1 mm, in particular at most 0.5 mm, in particular at most 0.3 mm, in particular at most 0.2 mm, in a direction perpendicular to the surface normal 41.

The total surface area of the mirror array 22 is in the range of 1 mm×1 mm to 50 mm×50 mm, in particular in the range of 10 mm×10 mm to 25 mm×25 mm. Other dimensions are likewise possible in principle. It can, in particular, also deviate from the square shape. The overhang of the total surface of the mirror array 22 beyond the total reflection surface thereof is also designated as lateral overhead. The ratio of lateral overhead to total extent in the same direction is at most 0.1, in particular at most 0.05, in particular at most 0.03, in particular at most 0.02, in particular at most 0.01. The lateral overhang is therefore less than the total extent of the total reflection surface of the mirror array 22 by at least one order of magnitude.

The optical component 40 comprises a carrying structure 43 besides the mirror array 22. The carrying structure 43 is arranged in a manner offset, in particular adjacent, with respect to the mirror array 22 in the direction of the surface normal 41. It preferably has a cross section identical to that of the substrate 30 of the mirror array 22. It generally projects beyond the substrate 30 and thus beyond the total surface of the mirror array 22 in a direction perpendicular to the surface normal 41 by at most 5 mm, in particular at most 3 mm, in particular at most 1 mm, in particular at most 0.5 mm, in particular at most 0.1 mm, in particular at most 0.05 mm, in particular not at all. An arrangement of this type is also designated as an arrangement according to the "shadow casting principle". This is understood to mean, in particular, that the carrying structure 43 is arranged completely within a parallel projection of the total surface of the mirror array 22 in the direction of the surface normal 41.

The carrying structure 43 is composed of a ceramic- and/or silicon-containing and/or aluminum-containing material. This enables heat dissipation from the mirror array 22 in conjunction with high mechanical stability. Examples of the material of the carrying structure 43 include ceramic materials, silicon, silicon dioxide, aluminum nitride and aluminum oxide, for example $Al_2O_3$ ceramic. The carrying structure 43 can be produced, in particular, from a wafer. The carrying structure 43 can also be produced from quartz or a glass wafer provided with so-called thermal vias.

The carrying structure 43 has a cutout 44 open on one side. The cutout 44 forms a receptacle space open on one side for receiving further functional constituent parts. The cutout 44 is delimited, on the opposite side thereof to the mirror array 22, by a base 45 of the carrying structure in the direction of the surface normal 41. It is delimited laterally, that is to say in a direction perpendicular to the surface normal 41, by an edge region 46 of the carrying structure 43. The edge region 46 has a width be in a direction perpendicular to the surface normal 41. In this case, $0.5 \times b \le b_C \le 2 \times b$ holds true. The edge region 46 of the carrying structure 43 can, in particular, be just as wide as the edge region 42 of the substrate 30, $b=b_C$.

The carrying structure 43 is mechanically connected to the mirror array 22 exclusively in the edge region 46. A seal element 61 is arranged between the carrying structure 43 and the mirror array 22. The seal element 61 is integrated into a metallization on the rear side 48 of the substrate 30 of the mirror array 22. It can also be embodied as a seal ring arranged on the edge region 46 of the carrying structure 4. Consequently, the receptacle space formed by the cutout 44 is encapsulated, that is to say closed off in a liquid-tight manner, in particular in a gas-tight manner, at least during the production of the component 40. In principle, it is possible to arrange the ASICs 52 in an encapsulated manner, that is to say in a manner closed off in a liquid-tight manner, in particular in a gas-tight manner. This also necessitates a continuous intermediate layer (not illustrated in the figures) between the mirror array 22 and the ASICs 52.

A multiplicity of signal lines 47 are integrated into the carrying structure 43. The signal lines 47 are embodied as electrical plated-through holes, so-called "vias". They are directly bonded to the rear side 48 of the mirror array 22, the rear side being the opposite side to the reflection surfaces 36. They are additionally provided with contact elements 50 on the opposite side to the mirror array 22, that is to say on the rear side 49 of the carrying structure 43. Each component 40 can have more than 30, in particular more than 50, in particular more than 70, signal lines 47. The signal lines 47 serve, inter alia, for the power supply of a control device 51 for controlling the displacement of the mirror elements 23. The control device 51 for controlling the displacement of the mirror elements 23 is integrated into the carrying structure 43. It is embodied, in particular, as an application specific integrated circuit 52 (ASIC). The component 40 can have a plurality of ASICs 52. It comprises at least one ASIC 52, in particular at least two, in particular at least four, in particular at least nine, in particular at least 16, in particular at least 25, in particular at least 100, ASICs 52. In this case, each of the ASICs 52 is signal-connected to at least one mirror element 23, in particular to a plurality of mirror elements 23, in particular to at least two, in particular at least four, in particular at least eight, mirror elements 23. For details of the control of the actuators for displacing the mirror elements 23, reference should be made to WO 2010/049 076 A2.

The signal lines 47 to the ASICs 52 run from the rear side 49 of the carrying structure 43 through the carrying structure 43 onto the rear side 48 of the mirror array 22, from there along the rear side 48 of the mirror array 22 and via a flip-chip contact 53 onto the ASICs 52. A description of flip-chip technology can be found in the book "Baugruppentechnologie der Elektronik-Montage" ["Technology for Assemblies in Electronic Mounting"] (Editor: Wolfgang Scheel, 2nd edition, Verlag Technik, Berlin, 1999). The signal lines to the integrated or local driver electronics are thus led on the rear side 48 of the mirror arrays 22. A control voltage generated on the ASIC 52 and serving for controlling the displacement of one of the mirror elements 23 is applied via a further flip-chip contact 53 onto the rear side 48 of the mirror array 22 to a corresponding electrode 54. Consequently, all the electrical contact-connections of one of the ASICs 52 are situated on the same side of the ASIC 52. They are situated, in particular, on that side of the ASIC 52 which faces the mirror array 22. Double-sided contact-connection and also through-plating of the ASIC 52, which is likewise possible in principle, are thereby avoided. A further advantage of such an arrangement of the signal lines 47 is that all the signal lines 47 can be laid on the rear side 48 of the mirror array 22 in a single metal layer. This leads to a simplification of the production process and thus to a reduction of the production costs.

Figure 25:
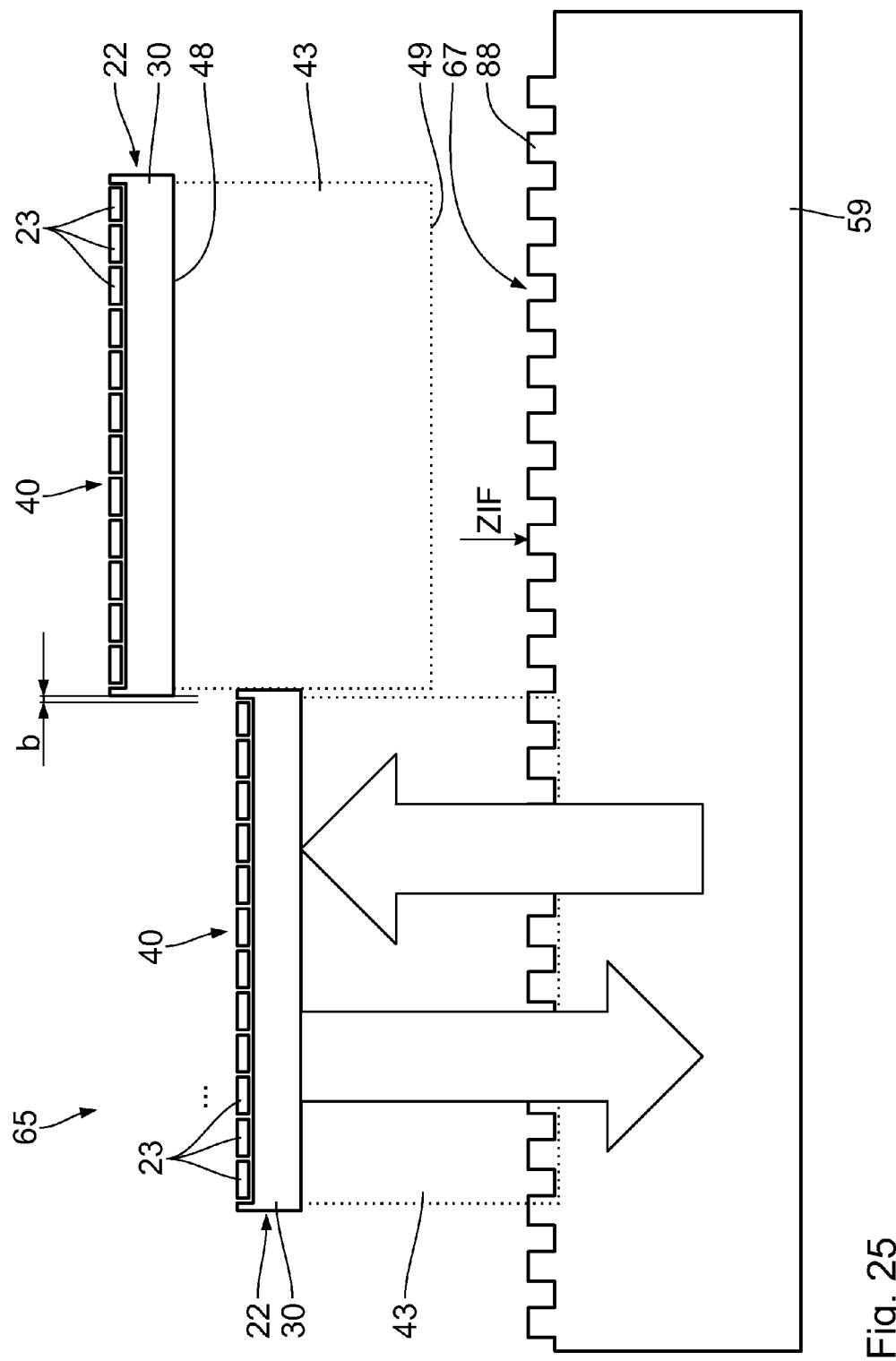
FIG. 25 shows a schematic illustration of the arrangement of the components on the baseplate for elucidating further aspects of the invention.
Figure 26:
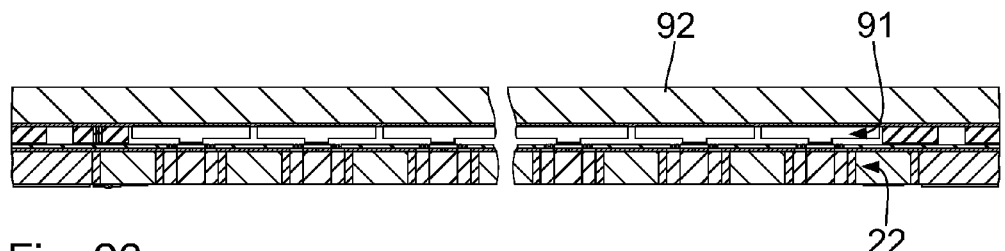
FIG. 26 to FIG. 34 show different intermediate products during the production of the optical component, FIG. 35 schematically shows method steps of a method sequence for producing the optical component, FIG. 36 schematically shows an illustration of the tool for handling the optical component, FIG. 37 schematically shows an illustration of the method for arranging a component on the baseplate for producing an assembly in accordance with FIG. 24, and FIG. 38 schematically shows method steps of a method sequence for producing an assembly in accordance with FIG. 24.
Figure 27:
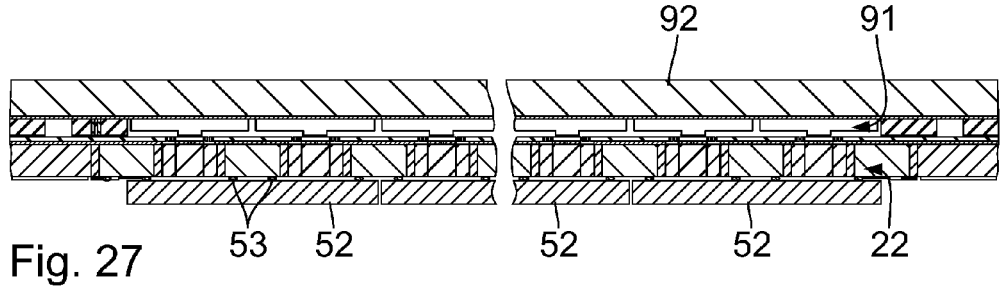
Figure 28:
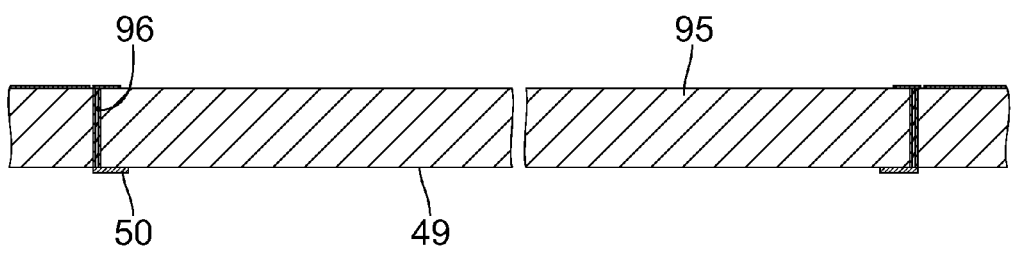
Figure 29:
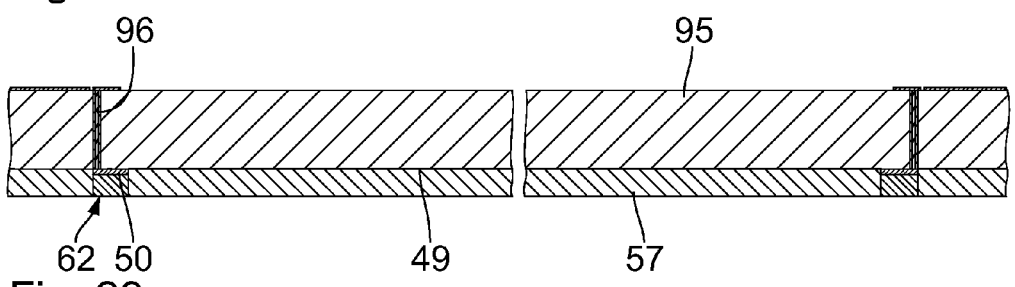
Figure 30:
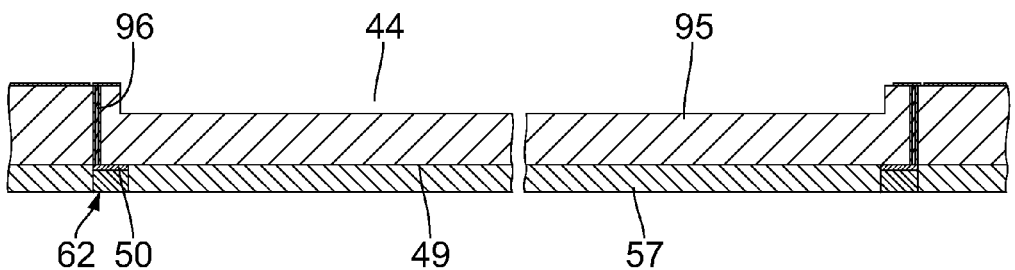
Figure 31:
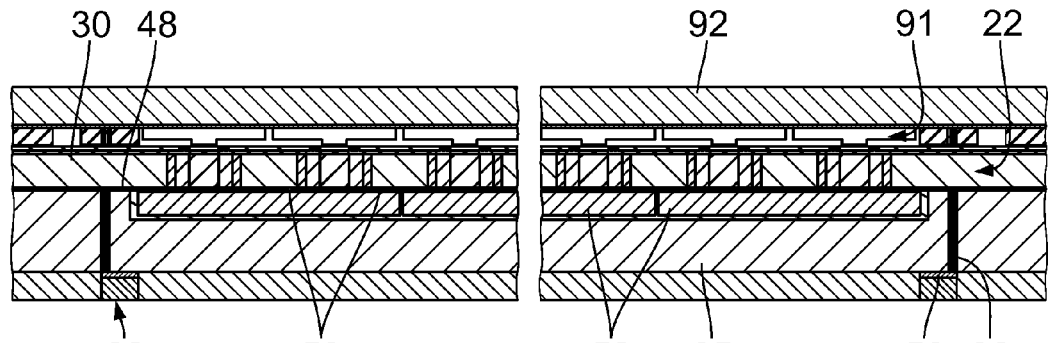
Figure 32:
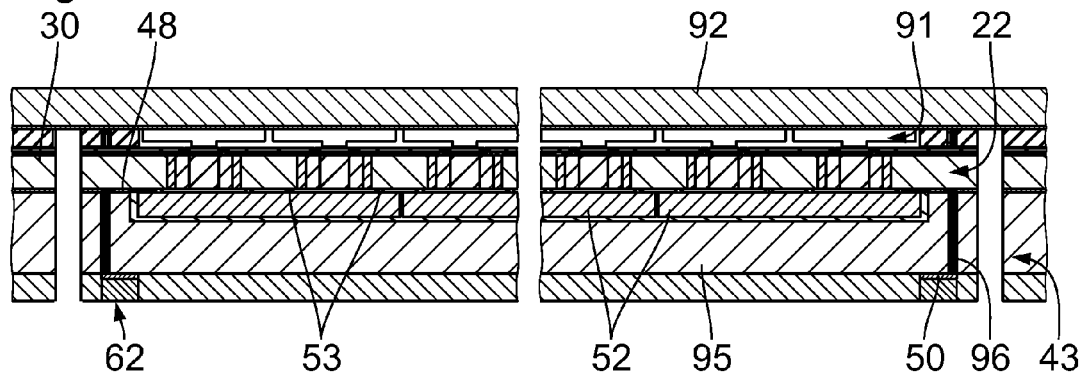
Figure 33:
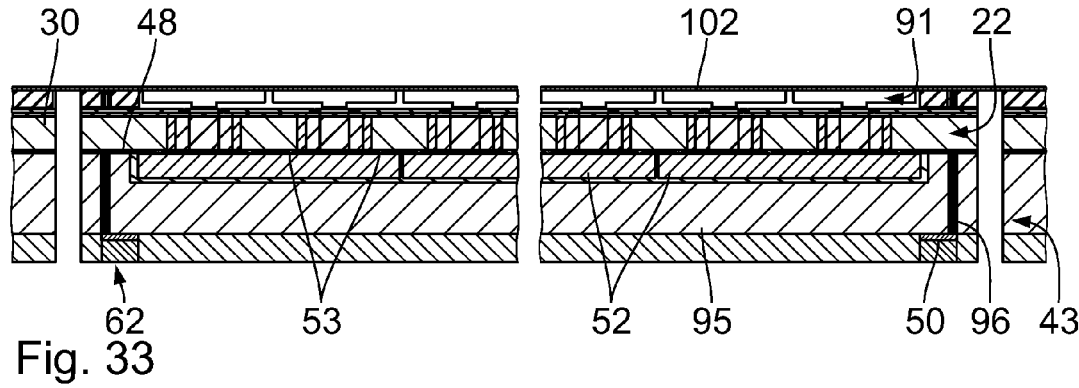
Figure 34:
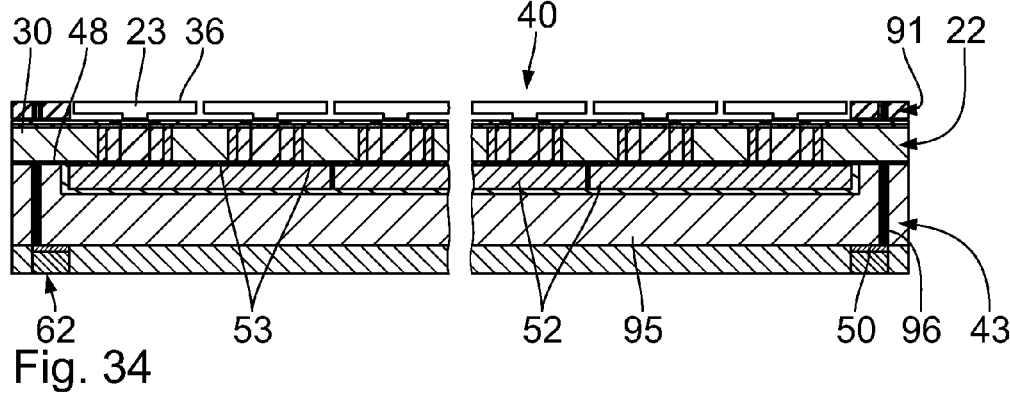

Furthermore, the signal lines 47 are embodied and arranged in such a way that specific signal lines 47 are laid together on the front side 43a of the carrying structure 43 facing the mirror array 22 and/or on the rear side 49 of the carrying structure. By way of example, the signal lines 47 for the supply voltages of the ASICs 52 are connected together. This leads to a signal reduction in the region of the carrying structure 43. The signal reduction in the region of the carrying structure 43 is, in particular, at least 10:1. On the rear side 49 of the carrying structure 43, the component 40 has an electrical interface 55. The interface 55 is arranged, in particular, completely on the rear side 49 of the carrying structure 43, the rear side being the opposite side relative to the mirror array 22. Lateral contacts, which are possible in principle, can be completely dispensed with. The "shadow casting principle" is therefore also complied with during the signal flow (cf. FIG. 25). Consequently, both the component parts of the component 40 and also the signal and heat flow in the latter are oriented in the direction of the surface normal 41. The component 40 therefore has vertical integration.

Figure 7:
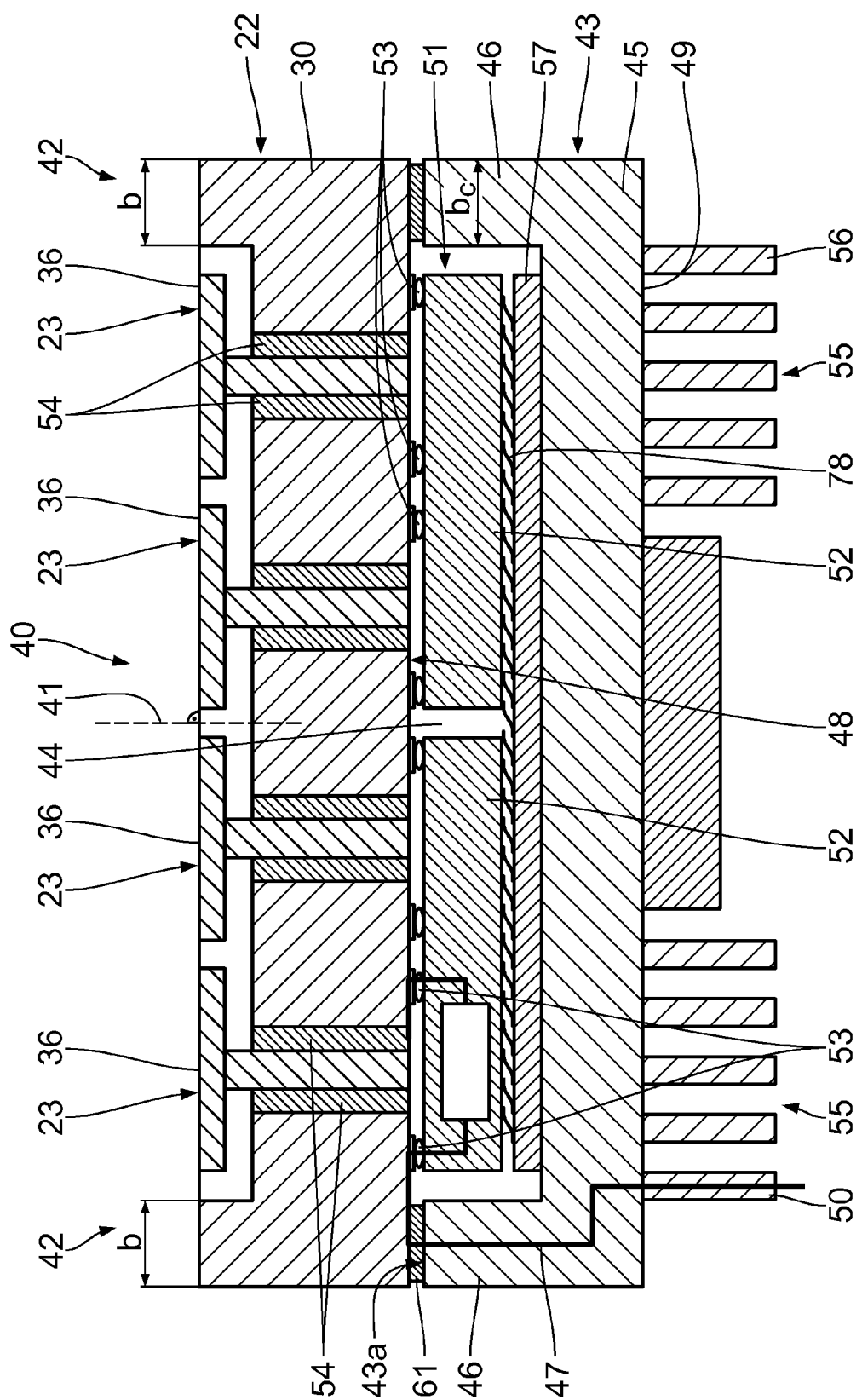
FIG. 7 shows a schematic cross section through an embodiment of the optical component with a mirror array (MMA)

In the case of the embodiment illustrated in FIG. 7, the electrical interface 55 has a multiplicity of contact pins 56 applied to the rear side 49 of the carrying structure 43. As an alternative thereto, the contact elements 50 of the electrical interface 55 can also be embodied in planar fashion, as illustrated by way of example in FIG. 9.

As an alternative thereto, the contact elements 50 of the electrical interface 55 can also be embodied as integrated pins in the carrying structure 43. In this case, plated-through holes (vias) in the carrying structure 43, which are embodied for example as through holes filled with gold, are partly uncovered in the region of the rear side 49 of the carrying structure 43. This can be achieved, in particular, by etching away part of the material of the carrying structure 43 that surrounds the plated-through holes. The uncovered segment of the plated-through holes then forms the contact element 50.

Furthermore, the carrying structure 43 comprises a ferromagnetic element 57. It comprises in particular at least one ferromagnetic element 57. A plurality of ferromagnetic elements 57 can also be provided. The ferromagnetic element 57 is embodied as a metal plate or as a metal foil. The ferromagnetic element 57 can also be embodied as a permanent magnetic element. In accordance with the embodiments illustrated by way of example in FIGS. 7 and 9, the metal foil 57 is arranged in the cutout 44 of the carrying structure 43. In particular, the metal foil is fixedly connected to the carrying structure 43. It can be bonded onto the carrying structure 43, for example. It can also be adhesively bonded. Direct electrolytic deposition of a ferromagnetic metal layer onto the carrying structure 43 as a ferromagnetic element 57 is likewise possible. The metal foil 57 can, as illustrated by way of example in FIG. 10, also be arranged on the rear side 49 of the carrying structure 43. In principle, a combination of the arrangement of the metal foil 57 in the cutout 44 and on the rear side 49 of the carrying structure 43 is also possible.

The metal foil 57 can be arranged in particular between the ASICs 52 and the base 45 of the carrying structure 43. In this case, the metal foil can also form a thermal interface between the ASICs 52 and the carrying structure 43. In this case, it is advantageous for the metal foil 57 to be embodied as a soft, corrugated metal foil, that is to say as a so-called spring foil.

Moreover, an additional heat-conducting element 78 can be arranged between the ASICs 52 and the base 45 of the carrying structure 43, in particular between the ASICs 52 and the metal foil 57. A plurality of heat-conducting elements 78 can also be provided. The ASICs 52 can, in particular, be embedded at least partly into the heat-conducting element 78 within the cutout 44. Such a thermal interface between the ASICs 52 and the base 45 of the carrying structure 43 improves the vertical integration of the heat flow through the component 40. Heat from the mirror array 22 and in particular from the ASICs 52 can in this case be dissipated directly, that is to say substantially in the direction of the surface normal 41, to the base 45 of the carrying structure 43 and through the latter.

Furthermore, the component 40 has orienting elements 58. The orienting elements 58 can be part of a positioning device, which facilitates firstly the gripping and handling of the component 40 and secondly the arrangement and orientation thereof on a baseplate 59, which will be described in even greater detail below. The orienting elements 58 can be embodied in particular optically, mechanically or electrically. They are arranged in particular in the edge region 42 of the substrate 30 of the mirror array 22. They are therefore arranged on the front side 60 of the component 40. Orienting elements 58 can correspondingly be provided on the rear side 49 of the carrying structure 43. The orienting elements 58 on the rear side 49 of the carrying structure 43 can be embodied, in particular, in such a way that, as a result of interaction with corresponding elements of the baseplate 59, they bring about self-alignment of the components 40 on the baseplate 59. The orienting elements 58 additionally prevent slipping of the components 40 on the baseplate 59. They can therefore bring about and ensure a predetermined arrangement and orientation of the components 40.

Aspects of a further embodiment of the component 40 are described below with reference to FIG. 8. Identical parts are given the same reference signs as in the exemplary embodiments described above, to the description of which reference is hereby made.

Figure 8:
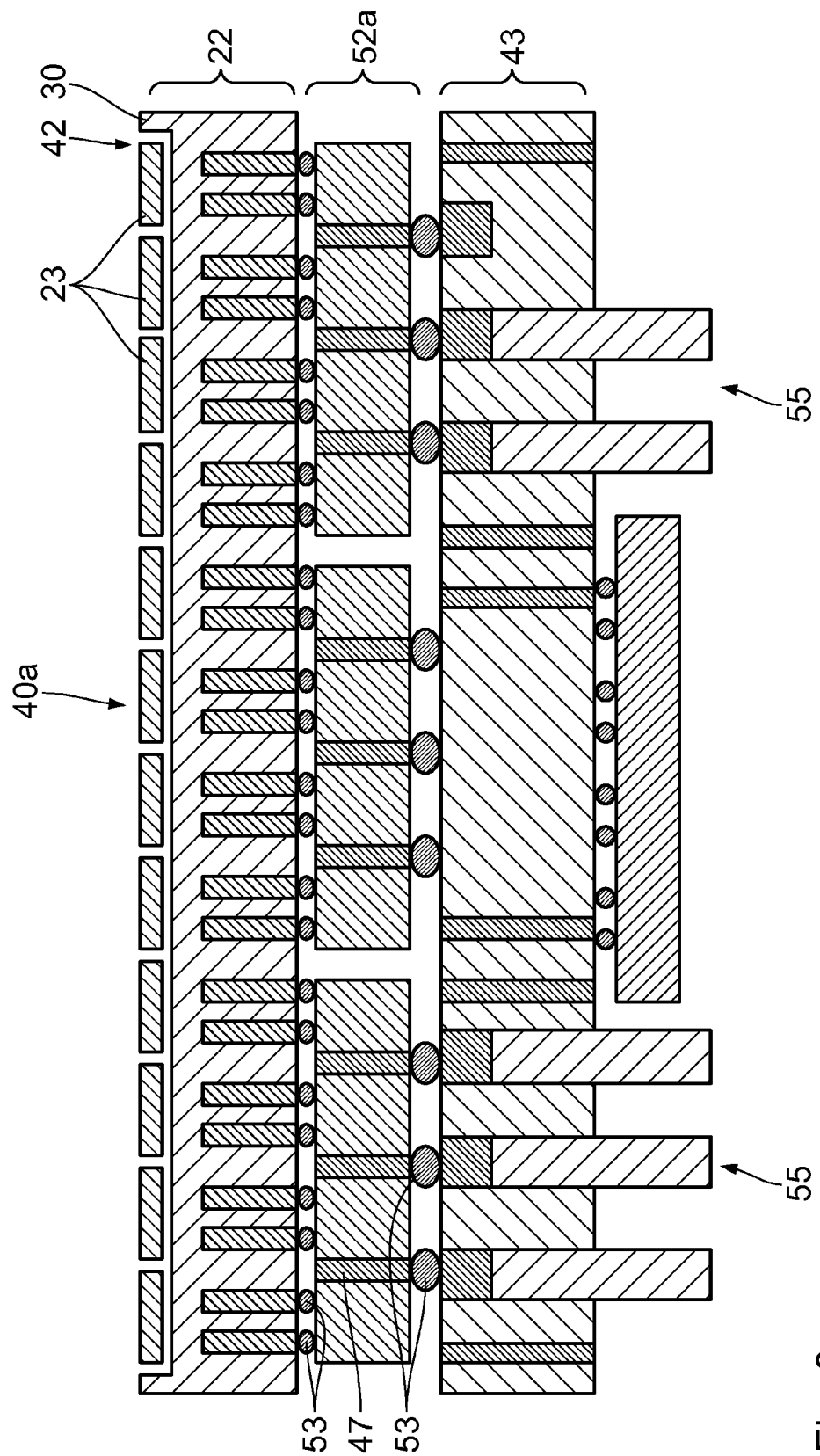
FIG. 8 to FIG. 10 show schematic cross sections through further embodiments of the optical component with a mirror array (MMA)
Figure 9:
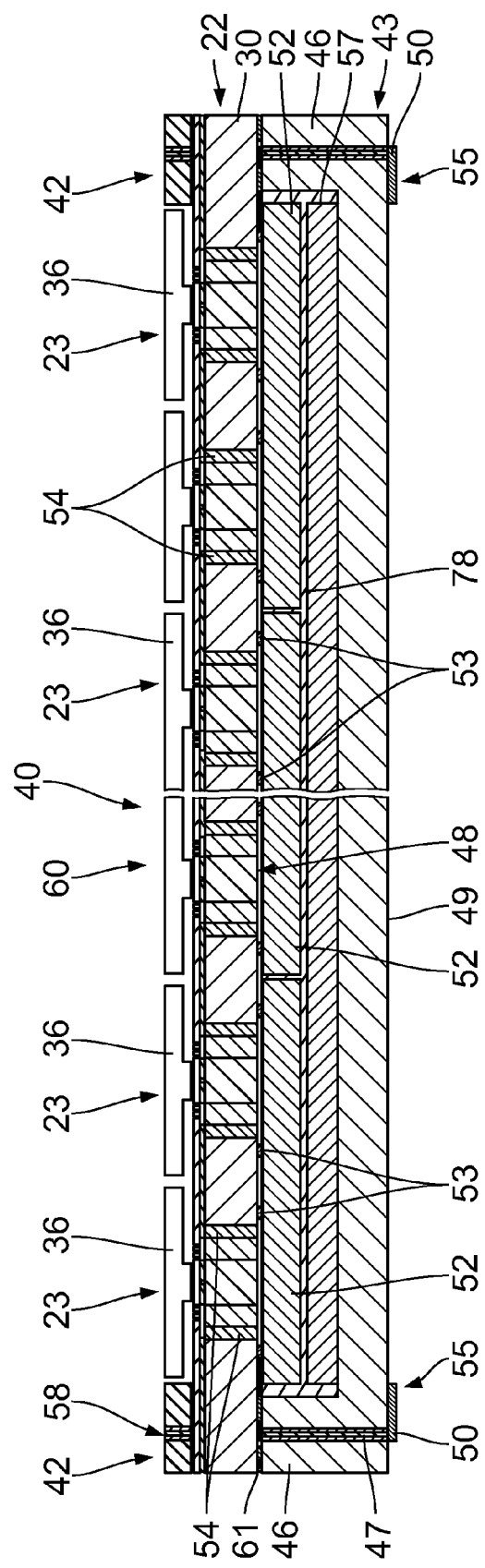
Figure 10:
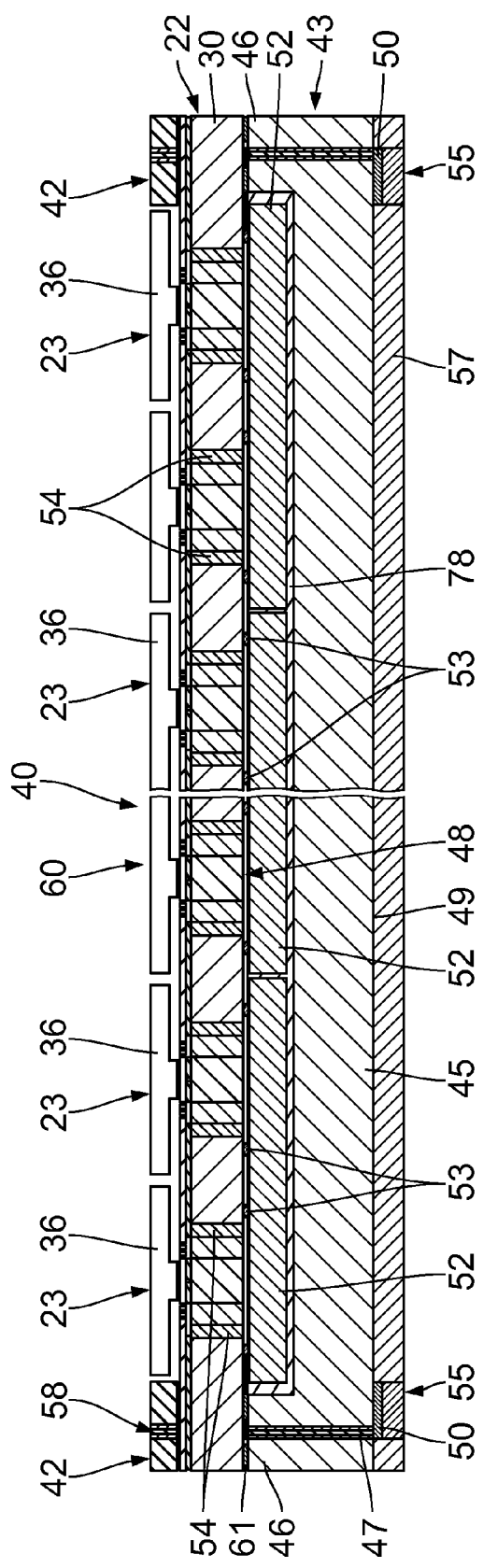
Figure 11:
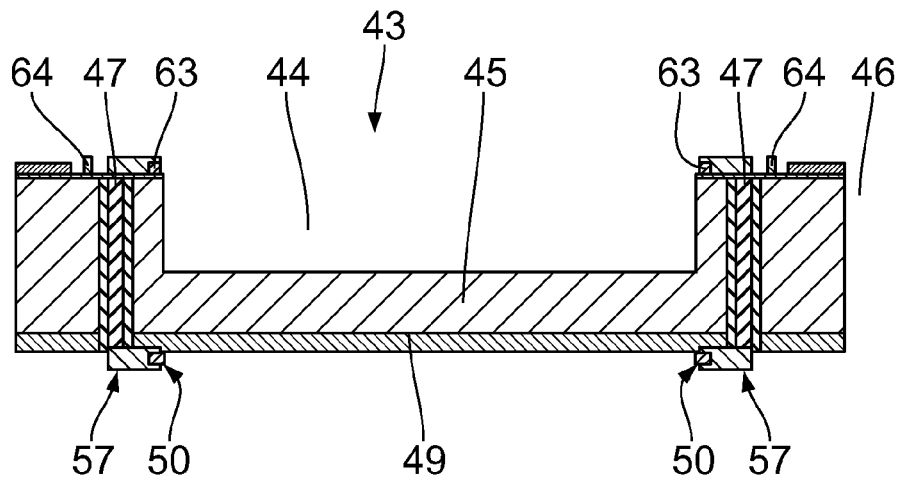
FIG. 11 to FIG. 15 show schematic illustrations of the carrying structure of the optical component for elucidating individual details.
Figure 12:
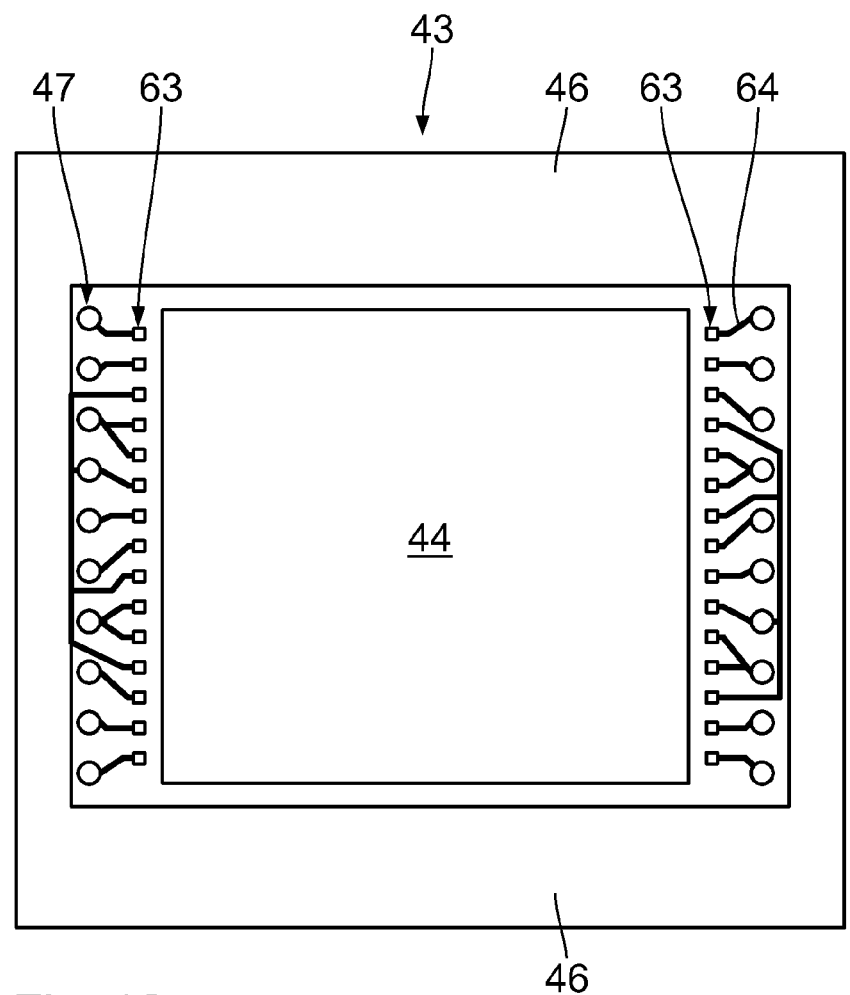
Figure 13:
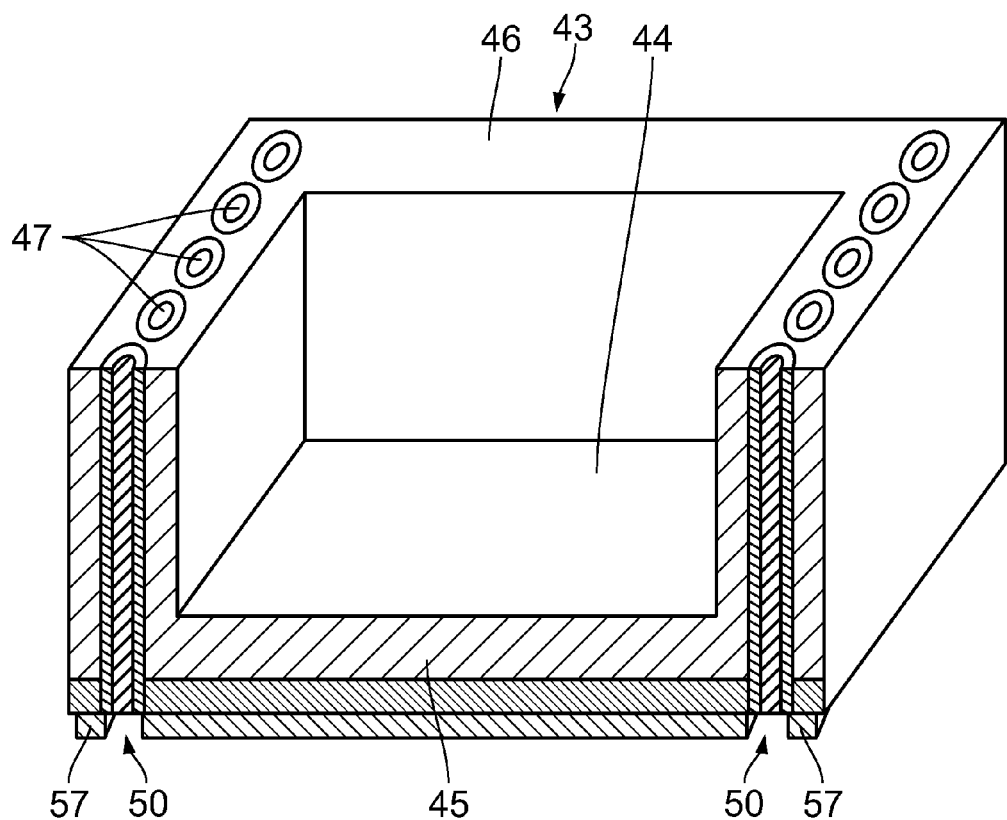
Figure 14:
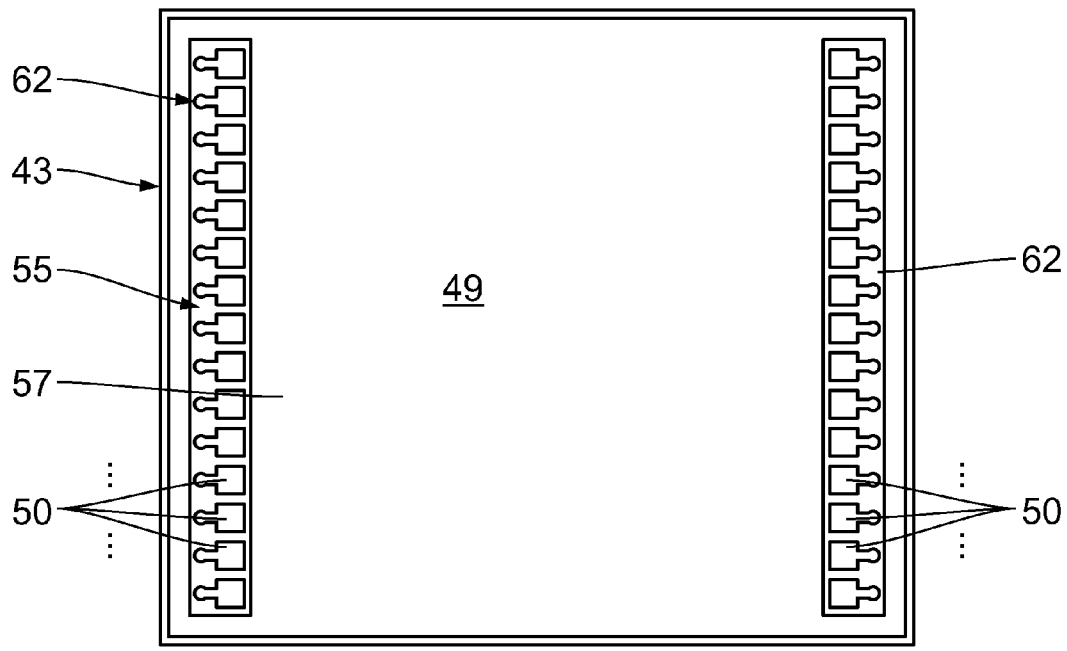

FIG. 8 schematically illustrates primarily details of the electrical contacts and signal lines 47 through the component 40a. In this embodiment, the signal lines 47 run through the ASICs 52a. For this purpose, the ASICs 52a are provided with so-called plated-through holes, in particular through-silicon vias (TSV). They have double-sided contact-connection. The signal paths through the component 40a are shortened even further as a result. The risk of a short circuit is reduced as a result. Moreover, the thermal resistance is reduced. This contributes to vertical integration and further reduction of the lateral overhead.

Further aspects of the carrying structure 43 are described below with reference to FIGS. 11 to 14. The signal lines 47 embodied as plated-through holes (through vias) are discernible, in particular, in FIGS. 11 and 13. The signal lines are arranged, in particular, in two rows lying opposite one another. In principle, it is also possible to arrange the signal lines 47 in one row or else more than two, in particular at least three, in particular at least four or more rows. They can, in particular, also be arranged on all four sides of the cutout 44. The signal lines 47 can, for example, also be arranged in double rows, in particular in offset double rows.

In the embodiment illustrated in FIGS. 11 to 14, the ferromagnetic metal foil 57 is applied to the rear side 49 of the carrying structure 43. It has two strip-shaped, in particular rectangular, openings 62 for making contact with the contact elements 50. Contact elements 63 for making contact with the mirror array 22 are additionally highlighted in FIGS. 11 and 12. The contact elements 63 are likewise arranged in two rows lying opposite one another. Alternative arrangements are likewise conceivable. Moreover, connecting lines 64 for signal reduction within the carrying structure 63 are illustrated by way of example. The illustration shows by way of example how a plurality of contact elements 63 can, via connecting lines 64 of this type, be led to the same signal line 47, that is to say electrically connected thereto. The actual number of signal lines 47, in particular of contact elements 63 of the carrying structure 43 can be significantly greater than is illustrated in FIGS. 11 to 14. The number of contact elements 50 on the rear side 49 of the carrying structure 43 is in particular in the range of 10 to 200, in particular in the range of 40 to 150. The number of signal lines 47 through the carrying structure 43 is in particular at least of the same magnitude as the number of contact elements 50 on the rear side 49 of the carrying structure 43. The number of the signal lines 47 through the carrying structure 43 is in particular in the range of 10 to 300, in particular in the range of 30 to 200. It is in particular at least 50, in particular at least 100. The number of contact elements 63 for making contact with the mirror array 22 is in particular at least of the same magnitude as the number of signal lines 47. In principle, it is also possible to connect a plurality of signal lines 47 to an individual contact element 63. In this case, the number of contact elements 63 can also be less than the number of signal lines 47. The number of contact elements 63 is in particular in the range of 10 to 1000. It is in particular at least 50, in particular at least 100.

Figure 15:
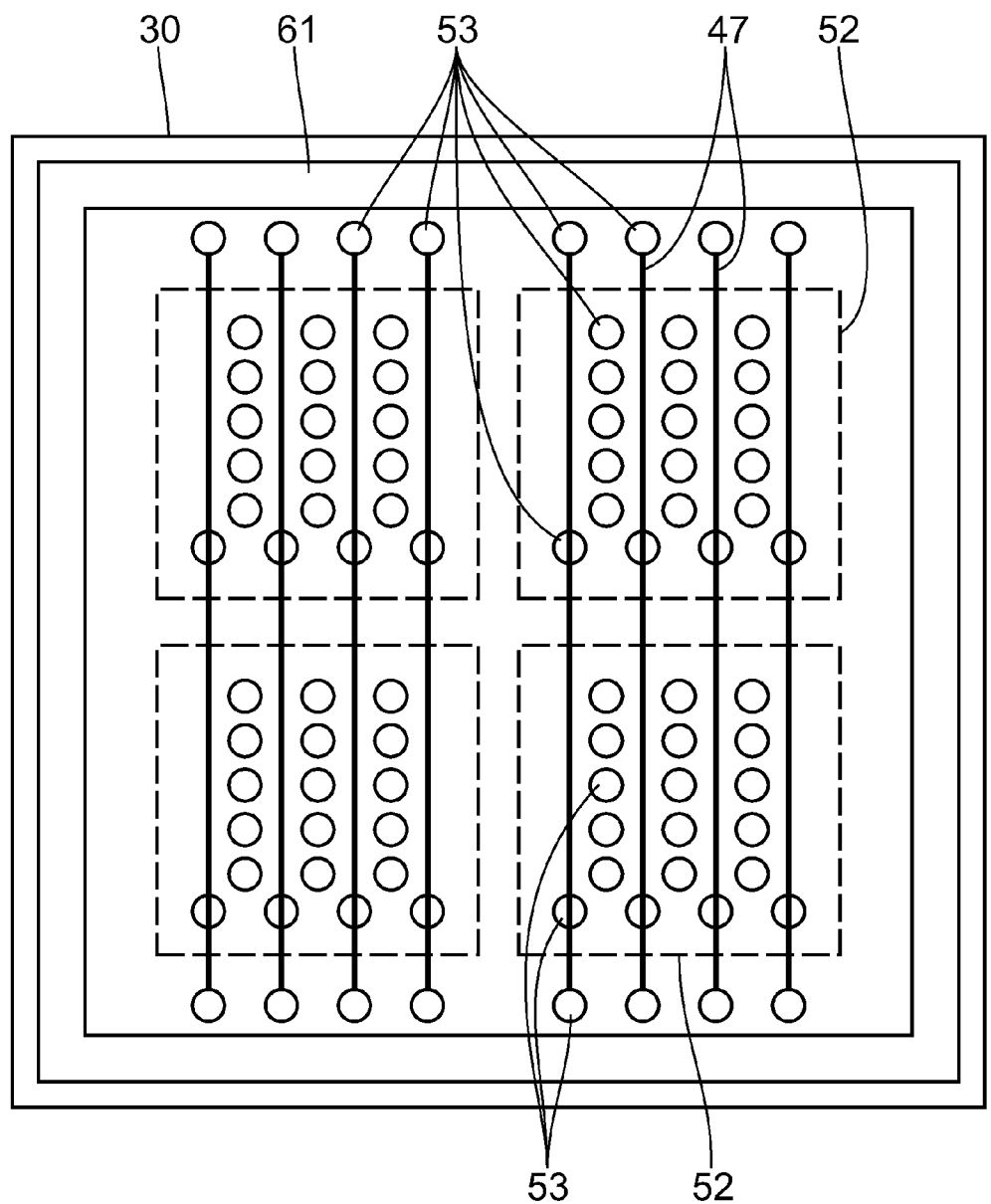
Figure 16:
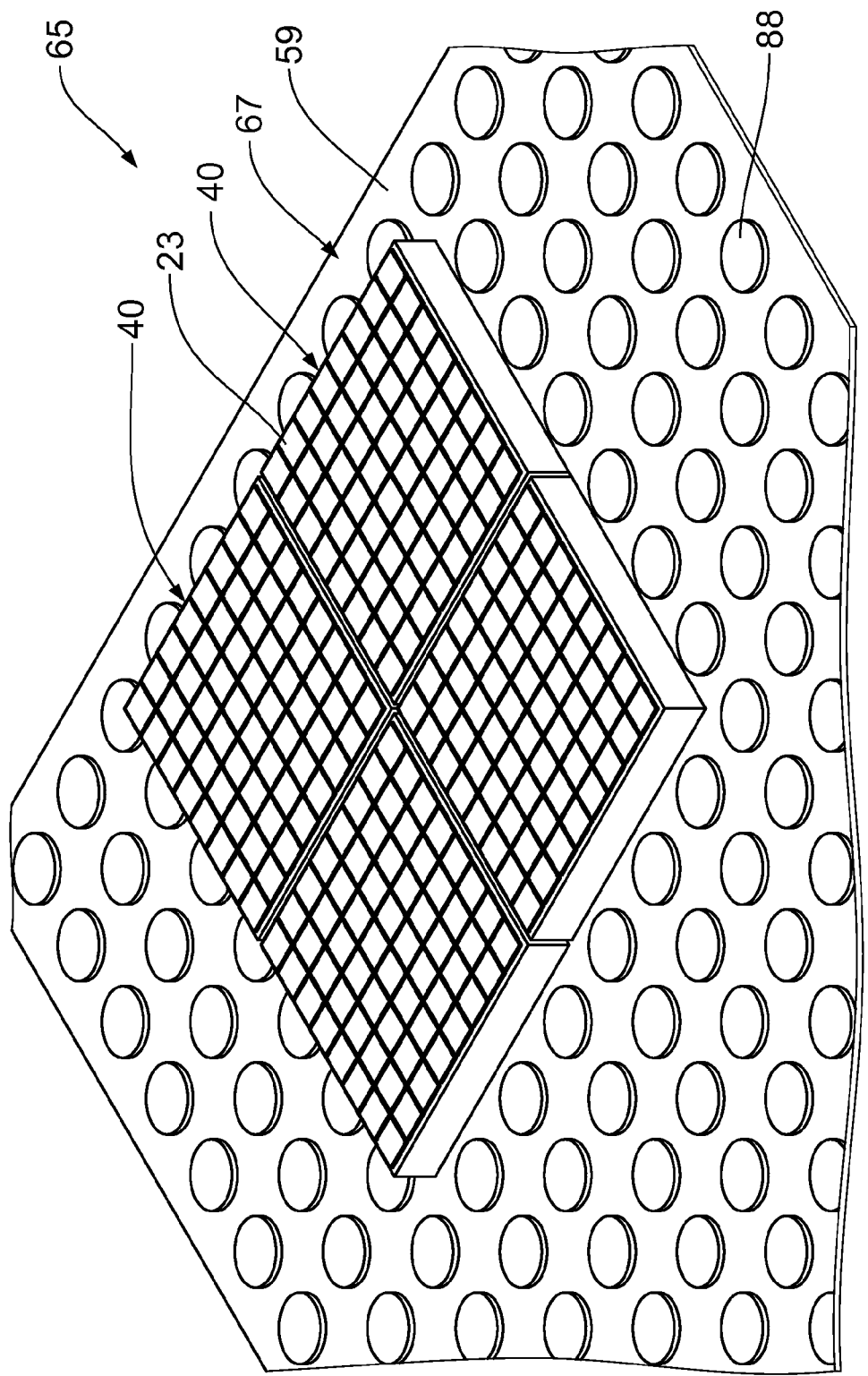
FIG. 16 shows an exemplary view of an optical assembly with four optical components with mirror arrays (MMA) arranged on a baseplate.
Figure 17:
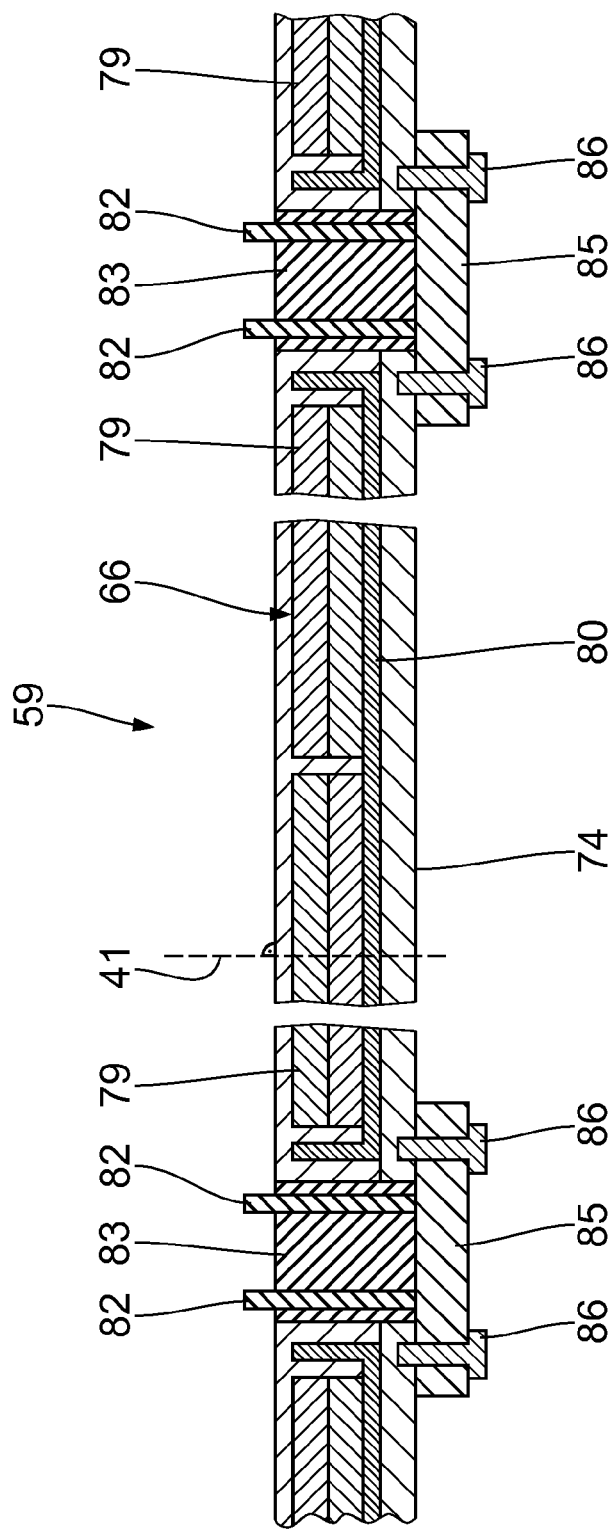
FIG. 17 shows a cross section through an embodiment of the baseplate.
Figure 19:
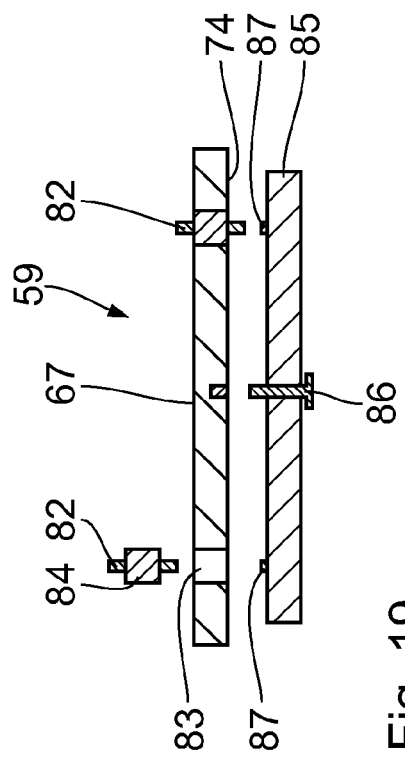
FIG. 19 and FIG. 20 show two alternative embodiments of the arrangement of the sprung contacts pins in the baseplate and of a circuit board arranged on the rear side of the baseplate.
Figure 20:
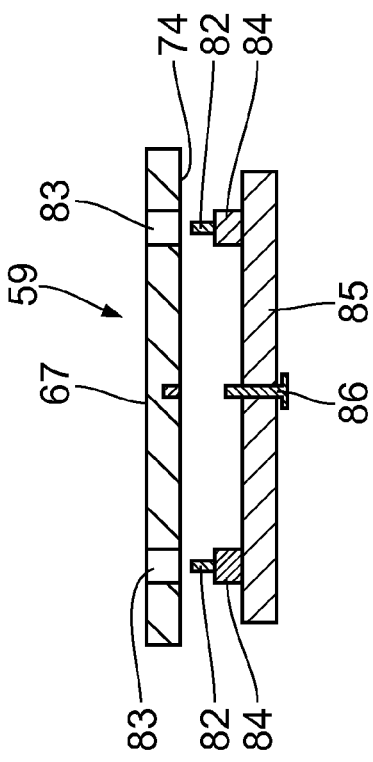
Figure 18:
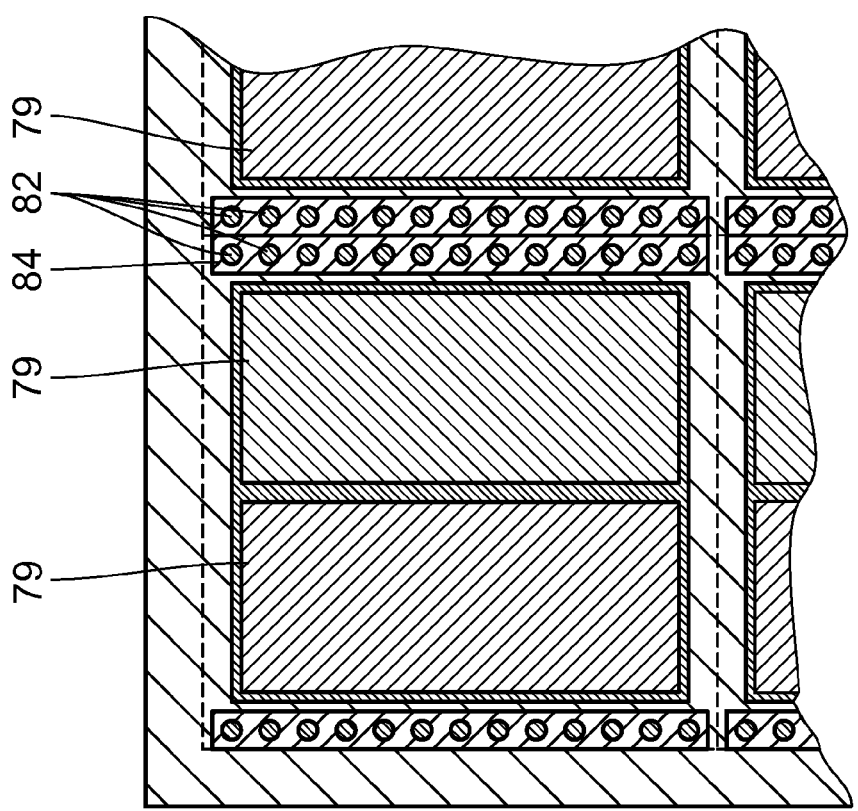
FIG. 18 shows a schematic plan view of the baseplate in accordance with FIG. 17, wherein the arrangement of the contact pins and of the magnets integrated into the baseplate is illustrated for elucidating individual details.

FIG. 15 illustrates by way of example the contacts on the rear side 48 of the mirror array 22. In this case, the position of four ASICs 52 situated underneath is illustrated by way of example, in a dashed fashion, for elucidation purposes. In this embodiment, the seal ring 61 is integrated into the metalized rear side 48 the substrate 30 of the mirror array 22. For each of the ASICs 52, groups of flip-chip contacts 53 arranged in matrix-like fashion are provided on the rear side 48 of the mirror array 22. Moreover, four signal lines 47 in each case are illustrated by way of example, which serve for the power supply and the supply of the ASICs 52 with input signals, in particular digital input signals. The signal lines 47 are therefore in particular supply voltage leads and/or data lines for controlling the ASICs 52. In this case, a group of signal lines 47 can serve for supplying a plurality of ASICs 52. Signal reduction thus occurs. Flip-chip contacts 53 are likewise provided for connecting the signal lines 47 to the ASICs 52. All the contacts 53 and signal lines 47 can be structured, that is to say integrated, in a single metal layer on the rear side 48 of the mirror array 22. A multilayered embodiment of the metallization on the rear side 48 of the mirror array 22 is likewise possible in principle. For exemplary details of the voltage and signal supply of the ASICs 52 and the control of the actuators of the mirror array 22 via the ASICs 52, reference should be made to WO 2010/049 076 A2.

The component 40 forms a self-contained functional unit.

Details and particulars of an optical assembly 65 are described below with reference to FIGS. 16 to 24. The assembly 65 can serve, for example, as facet mirrors 13, 14 of the illumination optical unit 4 of the projection exposure apparatus 1. In principle, the assembly 65 can also be part of the projection optical unit 7 of the projection exposure apparatus 1. As illustrated highly schematically in FIG. 16, the assembly 65 comprises the baseplate 59 and also a plurality of the optical components 40, 40a described above. The baseplate 59 forms a mechanically supporting element for the optical components 40. It has a size and form which can be chosen freely within the possibilities for the material processing of the material of the baseplate 59, in particular metal processing. Furthermore, the baseplate 59 serves for cooling the optical components 40. The components 40, 40a are arranged on the baseplate 59. They are fixed on the baseplate 59 via a fixing device 66, which will be described in even greater detail below. On account of the modular construction of the components 40, it is possible to arrange in principle any desired number of components 40 on the baseplate 59. The number and arrangement of the components 40 is merely restricted by the dimensions of the baseplate 59. Generally, the number of optical components 40 of the assembly 65 is at least 1, in particular at least 5, in particular at least 16, in particular at least 64, in particular at least 256. The components 40 are arranged in particular on the baseplate 59 in such a way that they parquet a predetermined region on the baseplate 59 substantially without any gaps. The components 40 are arranged in particular in a densely packed fashion on the baseplate 59. Adjacent components 40 are arranged at a distance d from one another on the baseplate 59. The distance d between adjacently arranged components 40 is in particular at most 1 mm, in particular at most 500 µm, in particular at most 300 µm, in particular at most 200 µm, in particular at most 100 µm, in particular at most 50 µm. The distance d between two adjacently arranged components 40 is in particular at most of the same magnitude as the lateral overhead of an individual component 40. On account of the vertical integration of the individual components 40 it is thus possible to produce a substantially arbitrarily shaped, in particular arbitrarily sized, total mirror surface by arrangement of the components 40 on the baseplate 59.

In accordance with one advantageous embodiment, the components 40 are arranged exchangeably, in particular exchangeably in a non-destructive manner, on the baseplate 59. As an alternative thereto, it is possible for the components 40 to be fixedly connected to the baseplate 59. They can be connected to the baseplate 59 for example via an adhesive layer (not illustrated in the figures). In particular the thermal conduction between the components 40 and the baseplate 59 can thereby be improved even further.

The thermal resistance between the components 40 and the baseplate 59 is preferably less than 1 K/W. The baseplate 59 is composed of a material having good thermal conductivity. It is composed, in particular, of metal, for example copper, aluminum or a compound of the elements. It has a polished surface on its front side 67 facing the components 40. This improves the mechanical and/or thermal and/or electrical contact between the components 40 and the baseplate 59. In particular the heat transfer resistance from a component 40 to the baseplate 59 can be reduced a result of the polishing of the surface.

In order to improve the cooling of the assembly 65, in particular of the optical components 40, the assembly 65 has a cooling system 68. The cooling system 68 can comprise one or a plurality of cooling lines 70 to which cooling fluid 69 can be applied. Each cooling line 70 comprises a feed line 71, a cooling section 72 integrated into the baseplate 59, and a discharge line 73. The feed line 71 and the discharge line 73 are both arranged on a rear side 74 of the baseplate 59, the rear side being the opposite side to the optical components 40. In particular a gas or liquid is appropriate as cooling fluid 69.

Figure 21:
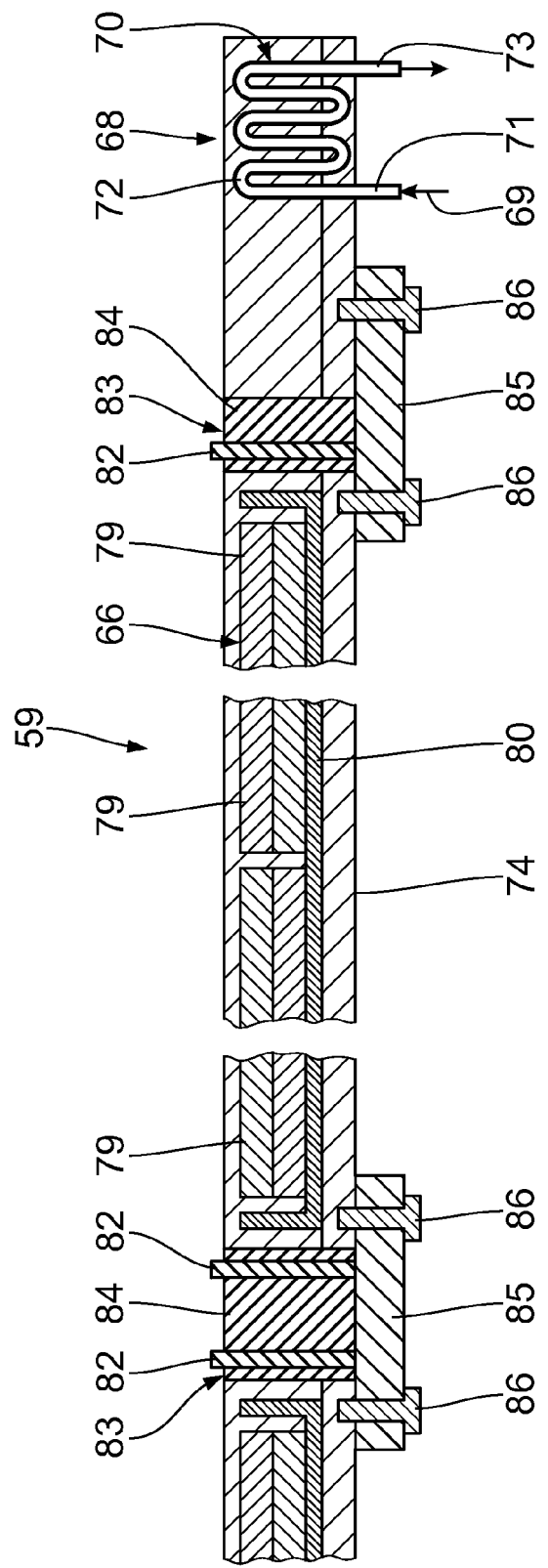
FIG. 21 to FIG. 23 show schematic illustrations of the baseplate for elucidating different embodiments of the cooling system.

The cooling system 68 can have one or a plurality of cooling lines 70. The latter can be arranged in a manner distributed over the periphery of the baseplate 59. It is also possible to arrange the cooling lines 70 only in a specific peripheral region of the baseplate 59, in particular only on one side of the baseplate 59. The cooling section 72 can be arranged, as illustrated in FIG. 21, only in an edge region of the baseplate 59. In this case, the cooling section is embodied, in particular, in meandering fashion.

Figure 22:
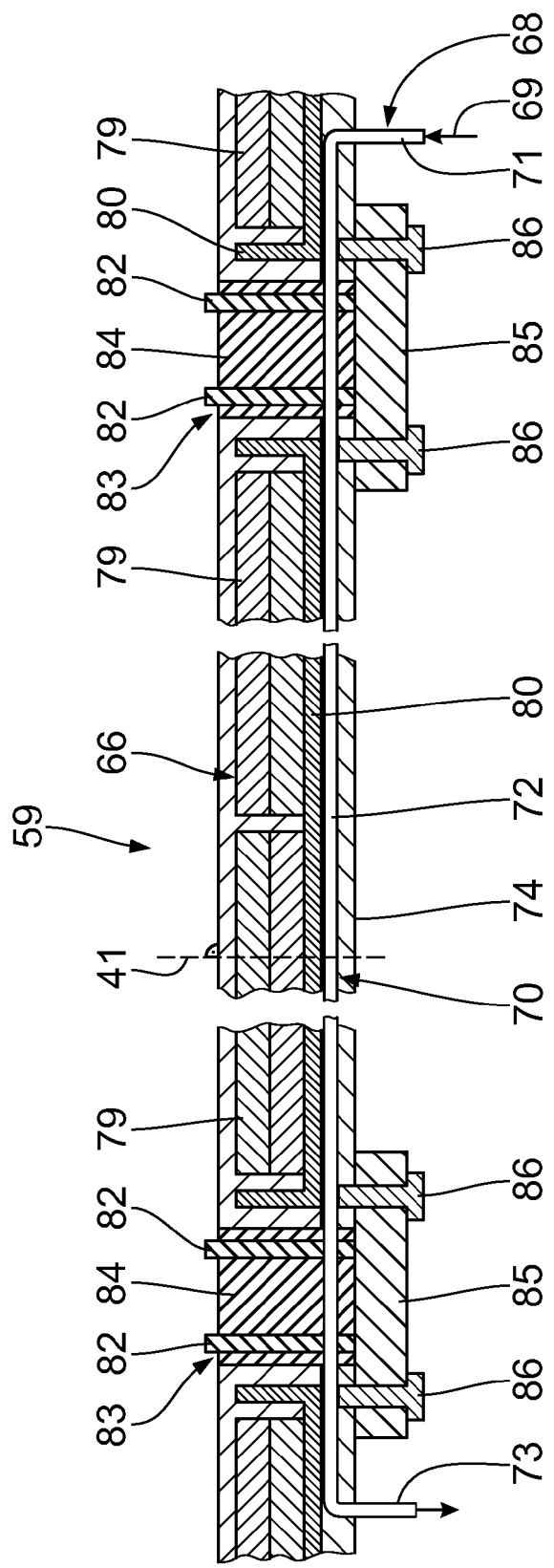

FIG. 22 illustrates an alternative embodiment of the cooling system 68. In this embodiment, the cooling lines 70, in particular the cooling section 72, are arranged in a manner running parallel to the extent of the baseplate 59, that is to say in particular perpendicular to the surface normal 41. The cooling section 72 is integrated into the baseplate 59 in this embodiment as well. Such an arrangement of the cooling lines 70, in particular of the cooling sections 72, makes it possible to reduce, in particular avoid, a lateral temperature gradient in the baseplate 59.

Figure 23:
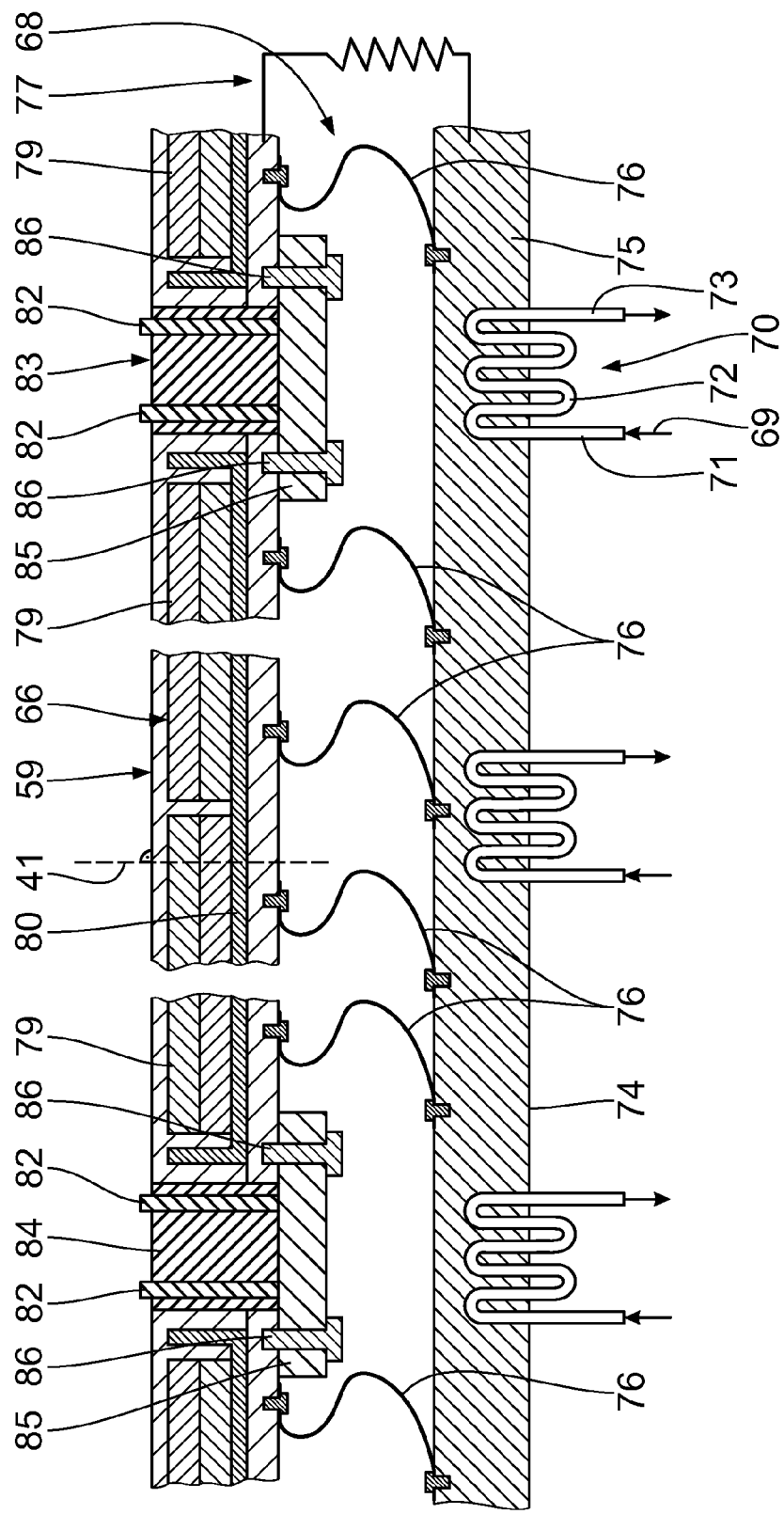
Figure 24:
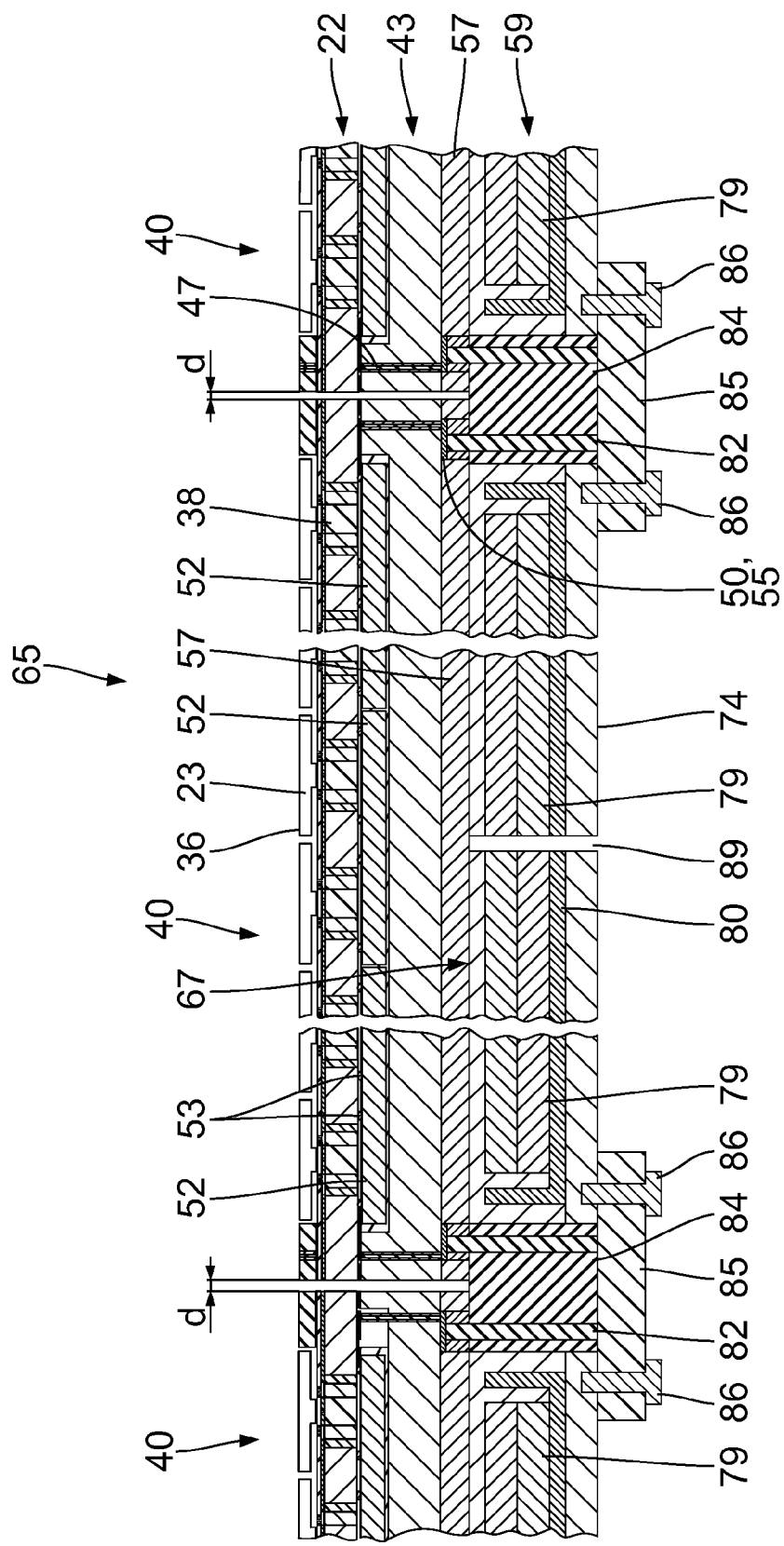
FIG. 24 shows a cross section through the optical assembly with components arranged on the baseplate.

FIG. 23 illustrates a further, alternative or additional embodiment of the cooling system 68. In this embodiment, the cooling lines 70 are arranged in a separate cooling plate 75. The cooling plate 75 is arranged at a distance from the baseplate 59. It is, in particular, mechanically decoupled from the baseplate 59. The cooling plate 75 can be arranged in particular in a manner offset with respect to the baseplate 59 in the direction of the surface normal 41. In order to ensure a sufficient heat flow from the baseplate 59 to the cooling plate 75, a multiplicity of heat-conducting elements 76 are provided. The heat-conducting elements 76 are mechanically soft elements having high thermal conductivity. By way of example, copper cables, copper foils or other mechanically soft elements specialized for thermal conduction are appropriate for them. In one particularly advantageous embodiment, the heat-conducting elements 76 can be made from encapsulated highly oriented graphite (HOPG).

In principle, the mechanical decoupling of the baseplate 59 from the cooling plate 75 can be further improved by additional mechanical damping elements 77, which are arranged between the baseplate 59 and the cooling plate 75. In this embodiment of the cooling system 65, transmission of oscillations excited by the cooling liquid flow to the baseplate, in particular to the components 40 arranged thereon, in particular to the mirror elements 23, can be reduced, in particular avoided to the extent of at least 90%. This improves the positional stability of the mirror elements 23 and hence the optical quality of the mirror array 22 of the component 40 of the assembly 65.

In principle, it is also possible to arrange the cooling plate 75 differently, for example in a manner laterally offset with respect to the baseplate 59. Moreover, the cooling plate 75 can have leadthrough openings (not illustrated in FIG. 23) for leading through electrical signal lines to the baseplate 59.

The cooling system 68 can thus be linked to the baseplate 59 directly or indirectly. It can, in particular, be embodied in a manner integrated into the baseplate or separately from the latter and connected to the latter via the heat-conducting elements 76.

The fixing device 66 is described in greater detail below. The fixing device 66 comprises at least one, in particular a plurality of, magnetic means. It is therefore also designated as a magnetic fixing device 66. It comprises in particular an arrangement of a plurality of permanent magnets 79. The permanent magnets 79 are arranged in such a way that their north pole and south pole are respectively arranged alongside one another in the direction of the surface normal 41. For each component 40 to be arranged on the baseplate 59, two permanent magnets 79 having mutually opposite polarities are arranged in a manner lying alongside one another in a direction perpendicular to the surface normal 41. A different number of permanent magnets 79 per component 40 is likewise possible. It is possible, in particular, to provide one, four or eight permanent magnets 79 per component 40. The arrangement of the permanent magnets 79 is chosen in such a way that the holding force exerted by the latter on the component 40 is optimized.

The fixing device 66, in particular the permanent magnets 79, are integrated into the baseplate 59.

The fixing device 66 furthermore comprises a ferromagnetic element 80. The additional ferromagnetic element 80 is likewise integrated into the baseplate 59. It serves for amplifying the magnetic flux generated by the permanent magnets 79.

Via the fixing device 66, a magnetic holding force can be exerted on the optical component 40, in particular on the ferromagnetic element 57 thereof. The holding force respectively exerted by the permanent magnets 79 of the fixing device 66 on the component 40 is in particular at least 10 N. It can be regulable. This can be achieved, for example, by regulating the distance between the permanent magnets 79 of the fixing device 66 and the ferromagnetic element 57 of the component 40.

The distance between the permanent magnets 79 and the ferromagnetic element 57 is in the range up to 1 cm, in particular in the range of 100 µm to 1 mm.

The permanent magnets 79 can advantageously be arranged in the baseplate 59 in such a way that self-aligning orientation of the component 40 on the baseplate 59 occurs upon interaction with the ferromagnetic element 57 of the component 40.

In one advantageous embodiment (cf. FIG. 37), the fixing device 66 can have additional electromagnets 81. In this case the electromagnets 81 are preferably arranged on the opposite side of the permanent magnets 79 to the components 40, in particular on the rear side 47 of the baseplate 59. The electromagnets 81 can be arranged, in particular, in a releasable manner on the rear side 74 of the baseplate 59. An additional, temporary magnetic field can be generated via the electromagnets. In particular a temporary compensation of the holding force exerted by the permanent magnets 79 on an optical component 40 is thereby possible. Via the electromagnets 81 it is thus possible to embody the fixing device 66 in such a way that the mechanical connection between the baseplate 59 and one of the optical components 40 in particular during a mounting/demounting process forms a so-called zero insertion force interface (ZIF).

Moreover, the baseplate 59 comprises means for producing an electrical contact with the interface 55 of the optical components 40. These are embodied as contact pins 82. The contact pins 82 are integrated in cutouts 83 in the baseplate 59. The contact pins 82 are arranged in rows. They are arranged, in particular, on respectively two mutually opposite sides of the permanent magnets 79 of the fixing device 66 (cf. FIG. 18). They are arranged, in particular in double rows between the permanent magnets 79 which serve for fixing adjacent components 40. The arrangement of the contact pins 82 corresponds, in particular, precisely to the arrangement of the contact elements 50 of the interface 55 on the rear side 49 of the optical components 40. They are arranged in such a way that a respective contact pin 82, upon the arrangement of a component 40 on the baseplate 59, forms an electrical contact with a contact element 50 of the interface 55 of the component. A contact resistance between a contact pin 82 and a contact element 50 is is in each case in particular at most 100 mΩ. In one advantageous embodiment, a grid of channels 89 open on both sides is arranged in the baseplate 59. The channels 89 extend from the front side 67 of the baseplate 59 as far as the rear side 74 thereof. They are arranged in particular in each case between two permanent magnets 79 of the fixing device 66. They are therefore arranged in such a way that they are arranged in each case centrally with respect to an optical component 40. Compressed air can be applied to the channels 89 in order to facilitate the demounting of a component 40.

In order to facilitate the formation of an electrical contact between a contact pin 82 and the associated contact element 50 of the interface 55 of the component 40, the contact pin 82 is in each case sprung, that is to say embodied as a spring contact pin, spring pin for short. It can be embodied, in particular, as sprung on both sides. The contact pins 82 can, in a manner combined in groups, in particular be cast into an electrically insulating substrate 84, for example composed of ceramic, glass or Teflon. The substrate 84 can be incorporated as a whole into the baseplate 59. An embodiment of this type enables a particularly simple arrangement of the contact pins 82 in the baseplate 59 and thus facilitates the method for producing the same.

On the rear side 74 of the baseplate 59, the contact pins 82 are in each case in electrical contact with a circuit board 85. The circuit board 85 is composed, in particular, of a ceramic or metallic material. The circuit board 85 can be, in particular, a printed circuit board (PCB). It serves for taking up and conducting the signals for controlling the individual mirrors 23 via the ASICs 52. In particular calibration data of individual optical components 40 can be stored in an additional microchip/ASIC applied to the circuit boards 85. The assembly 65 comprises, in particular, a multiplicity of circuit boards 85. The latter are embodiment in strip-shaped fashion. They are arranged, in particular, in a manner corresponding to the arrangement of the contact elements 50 of the interface 55 in parallel strips on the rear side 74 of the baseplate 59. It is possible to provide one circuit board 85 in each case for a double row of the contact pins 82. The circuit boards 85 are fixedly connected to the baseplate 59. They can be releasably connected to the baseplate 59. They are, in particular, screwed to the baseplate 59. In each case a plurality of connecting screws 86 per circuit board 85 serve for this purpose. When the circuit boards 85 are screwed to the baseplate 59, contact areas 87 on the circuit board 85 come into electrical contact with the contact pins 82. In an alternative embodiment, the contact pins 82 are directly connected, in particular soldered or welded, to the circuit board 85. In this case, they are introduced into the cutouts 83 in the baseplate 59 and thus integrated into the baseplate 59 upon the screwing of the circuit board 85.

The contact pins 82 can additionally serve as an optical and/or mechanical aid for orienting the components 40 on the baseplate 59. Additional optical and/or mechanical aids 88 of this type can also be arranged on the front side 67 of the baseplate 59. Aids 88 of this type are indicated schematically in a greatly simplified manner in FIG. 16. The aids 88 make it possible, in particular, for the baseplate 59 to be equipped with components 40 in an automated fashion. This facilitates the production of the assembly 65. The mechanical aids 88 are preferably embodied in such a way that they lead to a passive self-alignment of the optical components 40 on the baseplate 59.

Figure 35:
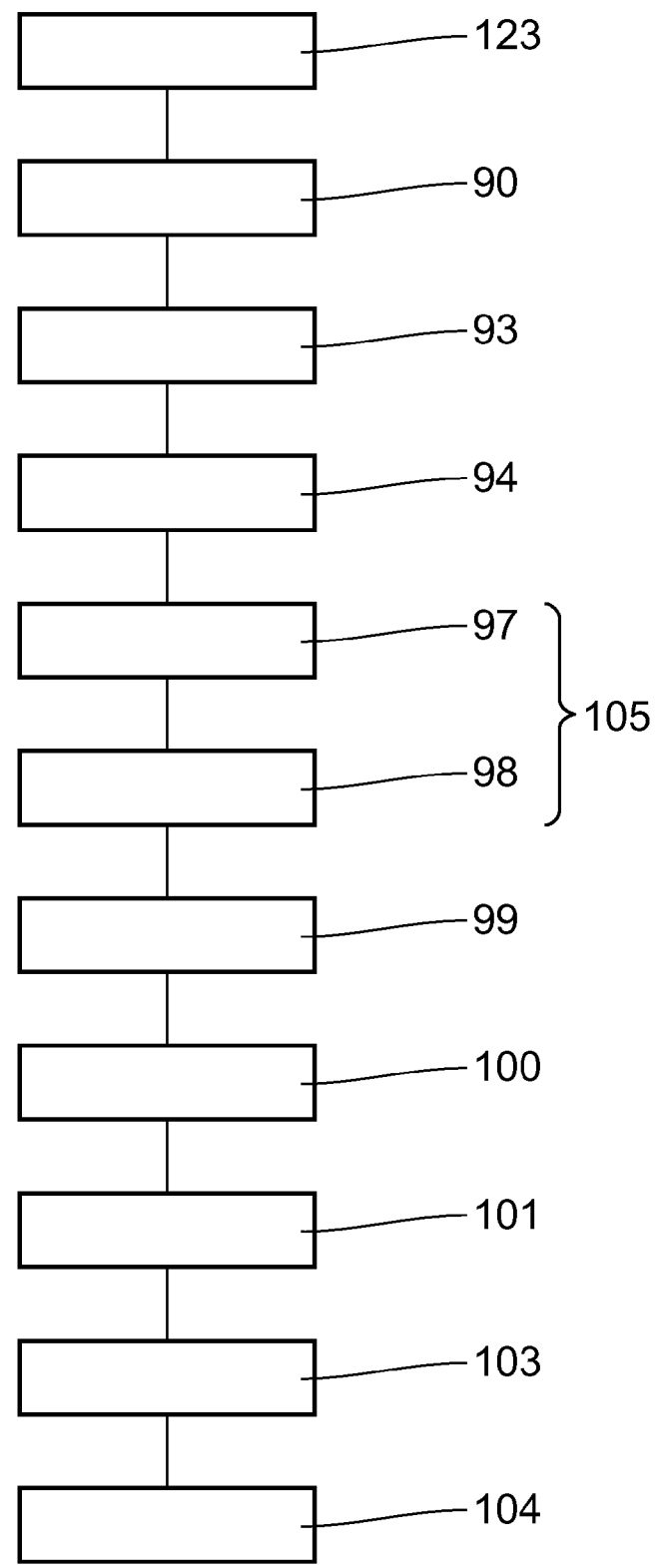

A method for producing the optical component 40 is described below with reference to FIG. 35. In order to elucidate the method, intermediate products obtained in this case are illustrated schematically in FIGS. 26 to 34. Firstly, a mirror array 22 is preprocessed in a preliminary process 123. The preliminary process can comprise a providing step, a polishing step and a coating step. For details of these preprocessing steps, reference should be made to WO 2010/049 076 A2, in particular FIG. 17 and associated description.

In a joining step 90, a mirror array wafer stack 91 with the preprocessed mirror array 22 and a carrier substrate 92 is produced. The carrier substrate 92 is also designated as "mirror handle wafer". It firstly serves for protecting the mirror elements 23 of the mirror array 22; it secondly contributes decisively to the mechanical stability of the mirror array wafer stack 91. The carrier substrate 92 can be connected to one or, in particular, to a plurality of preprocessed mirror arrays 22. The carrier substrate 92 can also already be part of the preprocessed mirror array 22. In particular, the carrier substrate 92 can already be part of the method for producing micromirrors having extremely smooth surfaces that is described in WO 2010/049 076 A2.

In a linking step 93, the ASICs 52 are then bonded onto the rear side 48 of the mirror array 22. This can be done in a flip-chip method. The intermediate product produced in this way is illustrated schematically in FIG. 27.

A providing step 94 involves providing a substrate 95 for producing the carrying structure 43. The substrate 95 is a wafer, in particular a silicon wafer, in particular a so-called through-silicon via (TSV) wafer. The latter already has, in particular, plated-through holes 96 for the signal lines 47. The substrate may also already have been provided with contact elements 50.

An applying step 97 involves applying the ferromagnetic metal foil 57 to the TSV wafer 95. In this case, the metal foil 57 is already prestructured. It already has, in particular, the openings 62 for access to the interface 55, in particular to the contact elements 50. If appropriate, a separate structuring step is provided for this purpose. The metal foil 57 is bonded, in particular, onto the rear side 49 of the TSV wafer 95. As an alternative thereto, electrolytic deposition of a ferromagnetic metal layer onto the rear side 49 of the TSV wafer 95 is possible.

In an etching step 98, the TSV wafer 95 is provided with the cutout 44. In the case of the intermediate product illustrated in FIG. 30, the cutout 44 is arranged on the opposite side of the TSV wafer 95 to the metal foil 57.

By way of example, a silicon deep etching method is provided for the etching step 98. In principle, the cutout 44 can also be introduced into the TSV wafer 95 in some other way, for example via a mechanical method.

In order to produce a plurality of components 40 in parallel, a plurality of cutouts 44 can be introduced into the TSV wafer 95. The cutouts 44 can be introduced into the TSV wafer 95 in particular simultaneously, in a single method step.

As described above, various embodiments with different arrangements of the metal foil 57 are possible. In the case of an arrangement of the metal foil 57 in the cutout 44, the etching step 98 is, of course, provided before the applying step 97.

The applying step 97 and the etching step 98 together form a pretreatment step 105 of the TSV wafer 95. The latter later forms the carrying structure 43.

In a connecting step 99, the TSV wafer 95 provided with the cutout 44 is connected to the mirror array wafer stack 91. The TSV wafer 95 is bonded, in particular, onto the rear side of the mirror array wafer stack 91. This results in the formation of electrical contacts between the plated-through holes 96 in the TSV wafer 95 and corresponding, associated flip-chip contacts 53 on the rear side 48 of the substrate 30 of the mirror array 22.

In a sawing step 100, the wafer 95 and the mirror array wafer stack 91 are sawn in the direction of the surface normal 41. In this case, the sawing cuts are arranged in a manner corresponding to the external dimensions of the component 40. During the sawing step 100, the TSV wafer 95 and the substrate 30 of the mirror array 22 are completely severed. The cutting depth of the sawing step 100 is chosen such that the carrier substrate 93, which forms the topmost layer of the mirror array wafer stack 91, is at most partly severed, in particular remains intact. After the sawing step 100, the later components 40 are thus exclusively held together by the carrier substrate 92.

In a subsequent singulation step 101, the carrier substrate 92 is removed for the purpose of singulating the components 40. An etching method is preferably provided for this purpose. After the removal of the carrier substrate 92, a protective layer 102 is still situated on the mirror array 22. The protective layer 102 is composed of silicon oxide, for example.

In a further etching step 103, the protective layer 102 is removed. In particular, etching via gaseous hydrofluoric acid is provided for this purpose. The etching step 103 can be effected, in particular, in a non-oxidizing atmosphere in order to prevent reoxidation of the reflection surfaces 36 of the mirror elements 23. Until the removal of the protective layer 102, the mirror elements 23 are protected by the latter. The mirror elements 23 are thus protected by the protective layer 102 and the carrier substrate 92 in particular during the linking step 93. The linking of the ASICs 52 and the connection of the TSV wafer 95 to the mirror array wafer stack 91 are effected, in particular, before the singulation step 101.

A coating step 104 can then be provided in order to provide the mirror elements 23, in particular the reflection surfaces 36 thereof, with a coating. The coating can be, in particular, an EUV-reflective coating. A multilayer coating can be involved, in particular.

One essential advantage of the above-described method for producing the component 40 is that the latter can be effected continuously in a batch process, that is to say at the wafer level. Process steps which are to be carried out at the chip level can be avoided. The method is significantly simplified as a result. The costs for the production of the component 40 can thereby be reduced.

Figure 36:
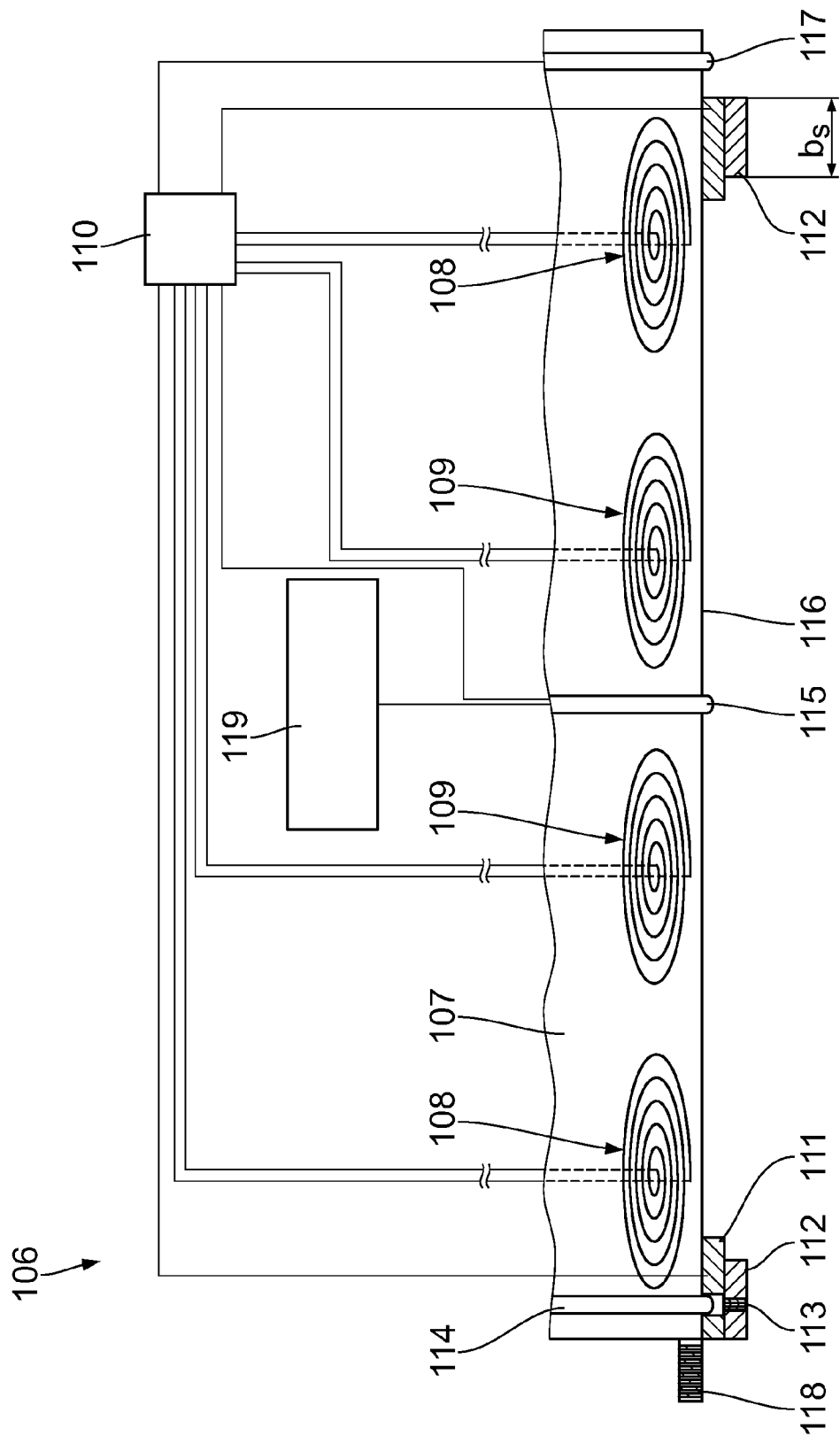

A tool 106 for handling, in particular for displacing, the optical component 40 is described below with reference to FIG. 36. The tool 106 comprises a base body 107. The base body 107 has dimensions adapted to the dimensions of the optical component 40. A plurality of electromagnets 108, 109 are arranged in the base body 107, two of which electromagnets are respectively illustrated by way of example in FIG. 36. Generally, the tool 106 comprises at least one electromagnet 108. The electromagnets 108 can be driven individually. For this purpose, the tool 106 has a control device 110. The electromagnets 109 can also be driven individually via the control device 110. A magnetic holding force for holding the component 40 can be generated via the electromagnets 108. The holding force can be controlled flexibly via the control device 110. The electromagnets 109 serve to compensate for the holding force exerted on the component 40 by the fixing device 66 in the baseplate 59. The holding force is dependent, in particular, on the distance between the component 40 and the baseplate 59. Through the control of the magnetic fields generated by the electromagnets 109 via the control device 110, the compensation of the force exerted by the fixing device 66 on the component 40 can be effected very precisely.

In principle, it suffices if the component 40 can be held by the tool 106 with a predetermined holding force. For this purpose, it is merely necessary for the magnetic field generated by the electromagnets 108 to be suitably controlled. The magnets 109 can be obviated, in principle.

For measuring the holding force exerted on the component 40, in particular the application pressure between the component 40 and the tool 106, the tool 106 has an array of pressure-sensitive sensors 111. The pressure-sensitive sensors 111 are signal-connected to the control device 110. They are arranged, in particular, respectively between a spacer element 112 and the base body 107. The spacer element 112 is embodied in accordance with the edge region 42 of the substrate 30 of the mirror array 22. It has, in particular a width $b_S$ that is less than the width b of the edge region 42. Via the spacer element 112, it can be ensured that contact between the optical component 40 and the tool 106 takes place exclusively in the edge region 42 and not in the region of the mirror elements 23.

In principle, the pressure-sensitive sensors 111 can be integrated into the spacer element 112.

Optical, in particular transmissive, structures 113 are introduced in the spacer element 112, the structures enabling the tool 106 to be accurately oriented with respect to the optical component 40. For monitoring and/or controlling the orientation of the tool 106 with respect to the component 40, an optical sensor 114, for example a mini camera, is additionally provided. The optical sensor 114 can be integrated into the base body 107. The optical sensor 114 can be adapted to the orienting elements 58 in particular for interaction with the latter.

Furthermore, provision is made of a central distance sensor 115 for measuring the distance between the tool 106 and the optical component 40. The distance sensor 115 is arranged in particular centrally, that is to say in the middle, on the front side 116 of the base body 107 facing the component 40. In principle, a plurality of, in particular at least four, distance sensors 115 can also be provided. The distance sensor 115 is signal-connected to the control device 110.

Furthermore, distance sensors 117 are provided in order to measure the distance and/or the orientation of the tool 106, in particular of the optical component 40 held by the latter, with respect to the baseplate 59. The distance sensors 117 are signal-connected to the control device 110. The tool 106 preferably has at least three, in particular at least four, distance sensors 117.

Moreover, one or a plurality of optical references 118 can be provided laterally on the base body 107 in order to monitor and/or control the orientation of the tool 106 or of the component 40 held by the tool 106, relative to the baseplate 59.

For particularly advantageous handling of the optical components 40, the base body 107 with the functional constituent parts described above is connected to a positioning system, in particular a pick-and-place robot 119. With the aid of the tool 106, it is possible for the baseplate 59 to be equipped with optical components 40 in an automated manner, in particular fully automatically.

Figure 37:
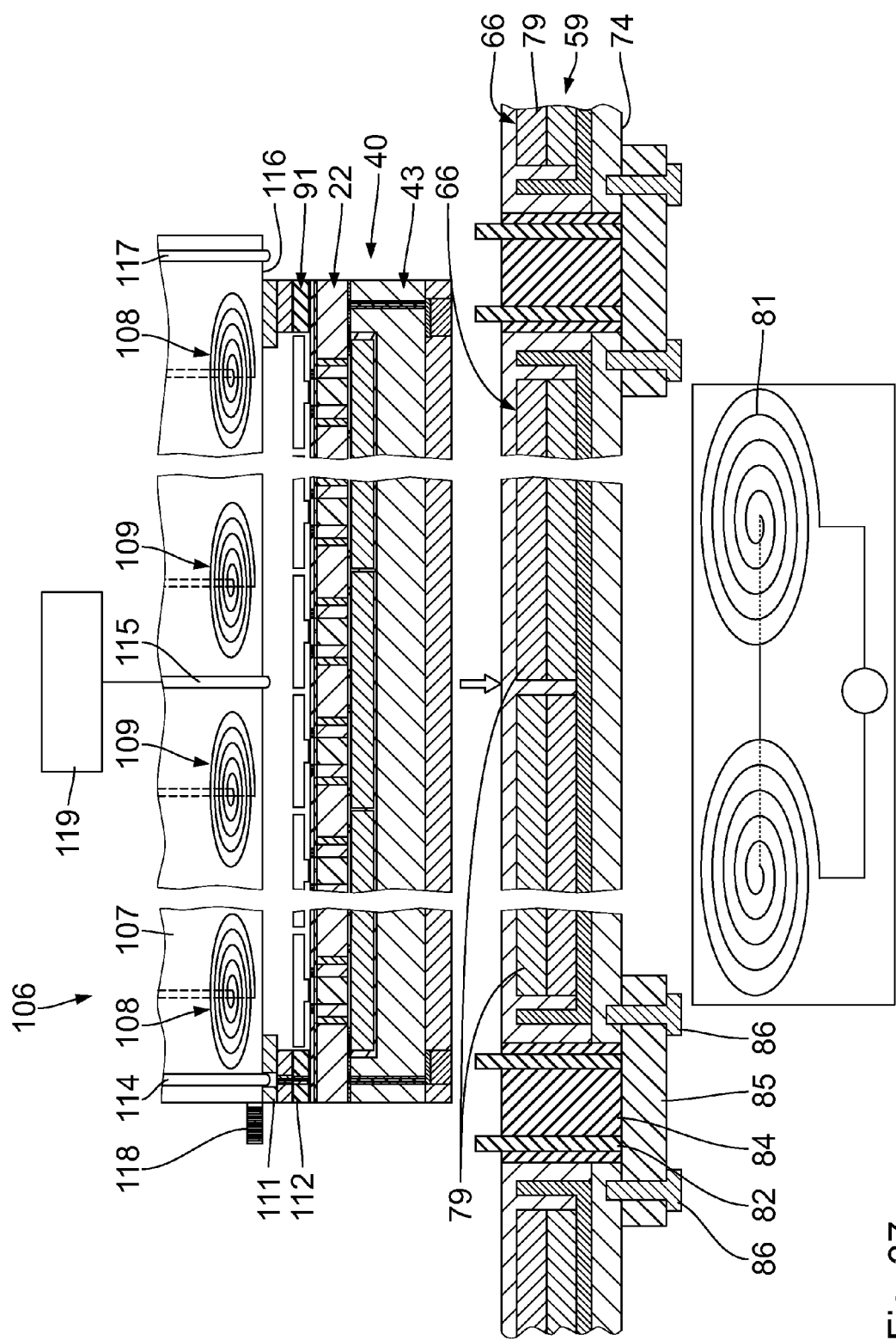
Figure 38:
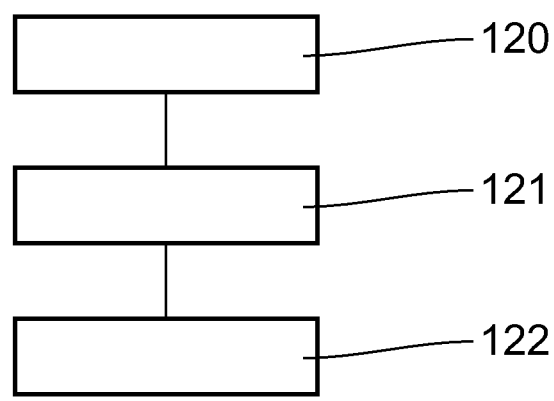

Aspects of a method for producing the optical assembly 65 are described below with reference to FIGS. 37 and 38. A providing step 120 involves providing the baseplate 59 with the fixing device 66. In principle, it is possible, for arranging a component 40 on the baseplate 59, to compensate for, in particular neutralize, the magnetic field generated by the permanent magnets 79 of the fixing device 66 via one or a plurality of electromagnets 81 arranged on the rear side 74 of the baseplate 59. Partial compensation of the magnetic field generated by the permanent magnets 79 via the magnets 81 is also possible. In this case, the electromagnets 81 can be provided as part of the assembly 65, in particular of the baseplate 59, and be fixedly or releasably connected to the baseplate 59. As an alternative thereto, the electromagnets 81 can also be part of a separate auxiliary tool. In principle, permanent magnets can also be provided instead of the electromagnets 81.

The at least partial compensation of the magnetic field generated by the magnets 79 via the magnets 81 is designated as an optional compensation step 121.

In one or a plurality of placement steps 122, the components 40 are arranged on the baseplate 59. This is done, in particular, with the aid of the tool 106. According to the invention, provision is made, for the purpose of arranging the components 40 on the baseplate 59, for the magnetic force exerted by the permanent magnets 79 of the fixing device 66 on the component 40 that is respectively to be arranged to be compensated for via an additional magnetic field. The additional magnetic field can be effected via of the magnets 81 and/or by means of the electromagnets 108 for holding the component 40 on the tool 106 and/or in particular via the electromagnets 109. The compensation is effected, in particular, in such a way that exclusively the force acting on the component 40 to be arranged is compensated for, while components 40 already arranged on the baseplate 59, if appropriate, are not influenced thereby. This is possible as a result of a suitable arrangement and/or driving of the magnets 81 and/or 108 and/or in particular 109. As a result of the compensation of the holding force exerted on the component 40 by the permanent magnets 79, the baseplate 59 forms a zero insertion force interface (ZIF) for the component 40 to be arranged. This enables particularly soft, gentle, in particular vibration-free, arrangement of the components 40 on the baseplate 59. In particular, the components 40 are prevented from being able to snap away abruptly upon approaching the baseplate 59.

For the purpose of handling, in particular for the purpose of arrangement on the baseplate 59, or for the purpose of removal from the latter, the components 40 are touched by the tool 106 exclusively in the edge region 42 of the substrate 30 of the mirror array 22. In particular, lateral contact can be dispensed with. In this case, the holding force exerted on the component 40 by the tool 106, in particular the application pressure, is measured with the aid of the sensors 111. The holding force can be controlled, in particular controlled automatically, in particular via the control device 110.

The approach of the component 40 to the baseplate 59, in particular the orientation thereof parallel to one another, is monitored via the distance sensors 117.

The orientation of the component 40 relative to the baseplate 59 is monitored via the optical references 118.

The pressure-sensitive sensors 111 and/or the distance sensors 117 indicate if the component 40 is in contact with the baseplate 59.

Provided that the component 40 has reached its predetermined position on the baseplate 59, the compensation of the holding force that can be exerted on the component 40 by the permanent magnets 79 can be reduced to zero. The compensation is reduced preferably gradually, in particular continuously.

For demounting a component 40, the holding force exerted on the component 40 by the permanent magnets 79 can in turn be compensated for via the magnets 81 and/or in particular via the electromagnets 108, 109 of the tool 106. The demounting of a component 40 can additionally be supported by applying compressed air to the corresponding channel 89.

When using the projection exposure apparatus 1 with one of the collector variants described above, the reticle 24 and the wafer bearing a coating that is light-sensitive to the illumination light 10 are provided. Afterward, at least one section of the reticle 24 is projected onto the wafer with the aid of the projection exposure apparatus 1. During the projection of the reticle 24 onto the wafer, the reticle holder and/or the wafer holder can be displaced in a direction parallel to the object plane 6 and/or parallel to the image plane 9. The displacement of the reticle 24 and of the wafer can preferably be effected synchronously with one another. Finally, the light-sensitive layer exposed via the illumination light 10 on the wafer is developed. A micro- or nanostructured component, in particular semiconductor chip, is produced in this way.

The invention claimed is:

1. A mirror array having a surface normal and a total surface which extends perpendicular to the surface normal, the mirror array comprising:
    a multiplicity of mirror elements, each mirror element comprising a reflection surface, each mirror element having at least one degree of freedom of displacement,
    wherein:
        a totality of the multiplicity of mirror elements define a parqueting of a total reflection surface of the mirror array;
        the mirror array is embodied modularly as a tile element so that the parqueting of the total reflection surface is extendable via tiling of a plurality of such mirror arrays; and
        a ratio of the total reflection surface to the total surface is at least 0.75.

2. The mirror array of claim 1, wherein the total surface extends beyond the total reflection surface by at most 5 mm in a direction perpendicular to the surface normal.

3. A method, comprising:
    using a batch method to connect a carrier substrate to a wafer stack which comprises a mirror array according to claim 1 covering a substrate.

4. The optical component of claim 1, wherein the ratio of the total reflection surface to the total surface is at least 0.85.

5. The mirror array of claim 1, wherein the ratio of the total reflection surface to the total surface is at least 0.95.

6. The mirror array of claim 1, wherein the totality of the multiplicity of mirror elements define a tessalation of the total reflection surface of the mirror array.

7. An optical component, comprising:
    a mirror array having a surface normal and a total surface which extends perpendicular to the surface normal, the mirror array comprising a multiplicity of mirror elements; and
    a carrying structure which is offset with respect to the mirror array in a direction of the surface normal,
    wherein:
        each mirror element comprises a reflection surface;
        each mirror element has at least one degree of freedom of displacement;
        a totality of the multiplicity of mirror elements define a parqueting of a total reflection surface of the mirror array;
        the mirror array is embodied modularly as a tile element so that the parqueting of the total reflection surface is extendable via tiling of a plurality of such mirror arrays; and
        the carrying structure projects beyond the total surface of the mirror array by at most 1 mm in a direction perpendicular to the surface normal.

8. The optical component of claim 7, wherein the carrying structure is mechanically connected to the mirror array exclusively in an edge region.

9. The optical component of claim 7, further comprising a control device configured to control displacement of the mirror elements, wherein the control device is integrated into the carrying structure.

10. The optical component of claim 7, further comprising an electrical interface on an opposite side of the carrying structure relative to the mirror array.

11. The optical component of claim 7, wherein the carrying structure comprises a ferromagnetic element.

12. An optical assembly, comprising:
a baseplate configured to arrange optical components;
an optical component according to claim 7; and
a fixing device which fixes the optical component, the fixed device being connected to the baseplate.

13. The assembly of claim 12, comprising at least five optical components, wherein each optical element comprises:
a mirror array; and
a carrying structure which is offset with respect to the mirror array in a direction of the surface normal, the carrying structure projecting beyond the total surface of the mirror array by at most 1 mm in a direction perpendicular to the surface normal.

14. The assembly of claim 12, wherein the optical component is exchangeably fixed to the baseplate.

15. The assembly of claim 12, wherein the fixing device comprises a magnetic mechanism.

16. The assembly of claim 12, further comprising sprung contact pins defining an electrical contact with an interface of the component.

17. A tool, comprising:
an electromagnet configured to generate a holding force; and
a spacer element configured to define a predetermined mechanical contact region between the tool and an optical component according to claim 7 so that the tool is configured to hold the optical component.

18. A method, comprising:
using a magnetic force to arrange an optical component according to claim 7 on a baseplate while at least partially compensating for the magnetic force via an additional magnetic field.

19. An optical unit, comprising:
an optical assembly, comprising:
a baseplate configured to arrange optical components;
an optical component according to claim 7; and
a fixing device which fixes the optical component, the fixed device being connected to the baseplate,
wherein the optical unit is a projection exposure optical unit.

20. An illumination system, comprising:
an EUV radiation source; and
a projection exposure optical unit, comprising:
an optical assembly, comprising:
a baseplate configured to arrange optical components;
an optical component according to claim 7; and
a fixing device which fixes the optical component, the fixing device being connected to the baseplate.

21. An apparatus, comprising:
an illumination system, comprising:
an optical assembly, comprising:
a baseplate configured to arrange optical components;
an optical component according to claim 7; and
a fixing device which fixes the optical component, the fixing device being connected to the baseplate,
wherein the optical unit is a projection exposure apparatus.

22. The apparatus of claim 21, further comprising a projection optical unit.

23. A method, comprising:
using a projection exposure apparatus to project at least a part of a reticle onto a region of a light-sensitive layer, the projection exposure apparatus comprising:
an illumination system, comprising:
an optical assembly, comprising:
a baseplate configured to arrange optical components;
an optical component according to claim 7; and
a fixing device which fixes the optical component, the fixed device being connected to the baseplate.

* * * * *

UNITED STATES PATENT AND TRADEMARK OFFICE
CERTIFICATE OF CORRECTION

PATENT NO. : 9,791,691 B2
APPLICATION NO. : 14/031464
DATED : October 17, 2017
INVENTOR(S) : Severin Waldis et al.

Page 1 of 1

It is certified that error appears in the above-identified patent and that said Letters Patent is hereby corrected as shown below:

In the Specification

Column 2, Line 6, delete "tesselation." and insert -- tessellation. --.

Column 2, Line 8, delete "tesselating," and insert -- tessellating, --.

Column 6, Line 62, after "μm,", insert -- in --.

Column 6, Line 64, after "μm,", insert -- in --.

Column 17, Lines 9-10, delete "counterelectrodes" and insert -- counter electrodes --.

Column 18, Line 12, delete "tesselation," and insert -- tessellation, --.

Column 26, Line 46, delete "is is" and insert -- is --.

In the Claims

Column 32, Line 32, Claim 6, delete "tesselation" and insert -- tessellation --.

Signed and Sealed this
Nineteenth Day of December, 2017

Joseph Matal
*Performing the Functions and Duties of the*
*Under Secretary of Commerce for Intellectual Property and*
*Director of the United States Patent and Trademark Office*